(12) United States Patent
Wu et al.

(10) Patent No.: US 12,183,629 B2
(45) Date of Patent: Dec. 31, 2024

(54) SELECTIVE HYBRID CAPPING LAYER FOR METAL GATES OF TRANSISTORS

(71) Applicant: Taiwan Semiconductor Manufacturing Co., Ltd., Hsinchu (TW)

(72) Inventors: Chung-Chiang Wu, Taichung (TW); Po-Cheng Chen, Jiaoxi Township (TW); Kuo-Chan Huang, Hsinchu (TW); Pin-Hsuan Yeh, Taipei (TW); Wei-Chin Lee, Taipei (TW); Hsien-Ming Lee, Changhua (TW); Chien-Hao Chen, Chuangwei Township (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 185 days.

(21) Appl. No.: 17/813,806

(22) Filed: Jul. 20, 2022

(65) Prior Publication Data

US 2022/0367261 A1 Nov. 17, 2022

Related U.S. Application Data

(62) Division of application No. 16/884,837, filed on May 27, 2020, now Pat. No. 11,532,509.
(Continued)

(51) Int. Cl.
*H01L 21/768* (2006.01)
*H01L 29/423* (2006.01)
*H01L 29/78* (2006.01)

(52) U.S. Cl.
CPC .. *H01L 21/76843* (2013.01); *H01L 21/76805* (2013.01); *H01L 29/42376* (2013.01); *H01L 29/785* (2013.01)

(58) Field of Classification Search
CPC ......... H01L 21/76843; H01L 21/76805; H01L 21/76834; H01L 21/76897;
(Continued)

(56) References Cited

U.S. PATENT DOCUMENTS 6,500,761 B1 12/2002 Wajda et al.
9,093,467 B1 7/2015 Xie et al.
(Continued)

FOREIGN PATENT DOCUMENTS

CN 108231588 A 6/2018
KR 20150093384 A 8/2015
(Continued)

*Primary Examiner* — Shahed Ahmed
*Assistant Examiner* — Vicki B. Booker
(74) *Attorney, Agent, or Firm* — Slater Matsil, LLP

(57) ABSTRACT

A method includes forming a gate electrode on a semiconductor region, recessing the gate electrode to generate a recess, performing a first deposition process to form a first metallic layer on the gate electrode and in the recess, wherein the first deposition process is performed using a first precursor, and performing a second deposition process to form a second metallic layer on the first metallic layer using a second precursor different from the first precursor. The first metallic layer and the second metallic layer comprise a same metal. The method further incudes forming a dielectric hard mask over the second metallic layer, and forming a gate contact plug penetrating through the dielectric hard mask. The gate contact plug contacts a top surface of the second metallic layer.

20 Claims, 26 Drawing Sheets

Related U.S. Application Data

(60) Provisional application No. 62/967,872, filed on Jan. 30, 2020.

(58) Field of Classification Search
CPC ............. H01L 29/42376; H01L 29/785; H01L 29/66795; H01L 29/4966; H01L 29/51; H01L 29/66545
See application file for complete search history.

(56) References Cited

U.S. PATENT DOCUMENTS

| | | |
|---|---|---|
| 9,449,830 B2 | 9/2016 | Kang |
| 9,502,466 B1 | 11/2016 | Chuang et al. |
| 10,840,151 B2 | 11/2020 | Eib et al. |
| 10,879,370 B2 | 12/2020 | Lim et al. |
| 11,088,025 B2 | 8/2021 | Hsieh et al. |
| 11,380,774 B2 | 7/2022 | Lim et al. |
| 2015/0021683 A1* | 1/2015 | Xie ................. H01L 21/823425 438/270 |
| 2017/0077256 A1 | 3/2017 | Adusumilli et al. |
| 2018/0315652 A1 | 11/2018 | Tsai et al. |
| 2019/0096679 A1 | 3/2019 | Kannan et al. |
| 2019/0096680 A1 | 3/2019 | Wei et al. |
| 2019/0148224 A1 | 5/2019 | Kuroda et al. |
| 2020/0105602 A1* | 4/2020 | Wu ..................... H01L 27/0922 |

FOREIGN PATENT DOCUMENTS

| | | |
|---|---|---|
| KR | 20180131346 A | 12/2018 |
| KR | 20190064425 A | 6/2019 |
| TW | 201839815 A | 11/2018 |
| WO | 2013033875 A1 | 3/2013 |

* cited by examiner

US 12,183,629 B2

SELECTIVE HYBRID CAPPING LAYER FOR METAL GATES OF TRANSISTORS

PRIORITY CLAIM AND CROSS-REFERENCE

This application is a divisional of U.S. patent application Ser. No. 16/884,837, entitled "Selective Hybrid Capping Layer for Metal Gates of Transistors," and filed May 27, 2020, which claims the benefit of the U.S. Provisional Application No. 62/967,872, entitled "Selective Hybrid Capping Layer for Metal Gates of Transistors," and filed on Jan. 30, 2020, which applications are hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to suit to the requirements of the NMOS devices and PMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
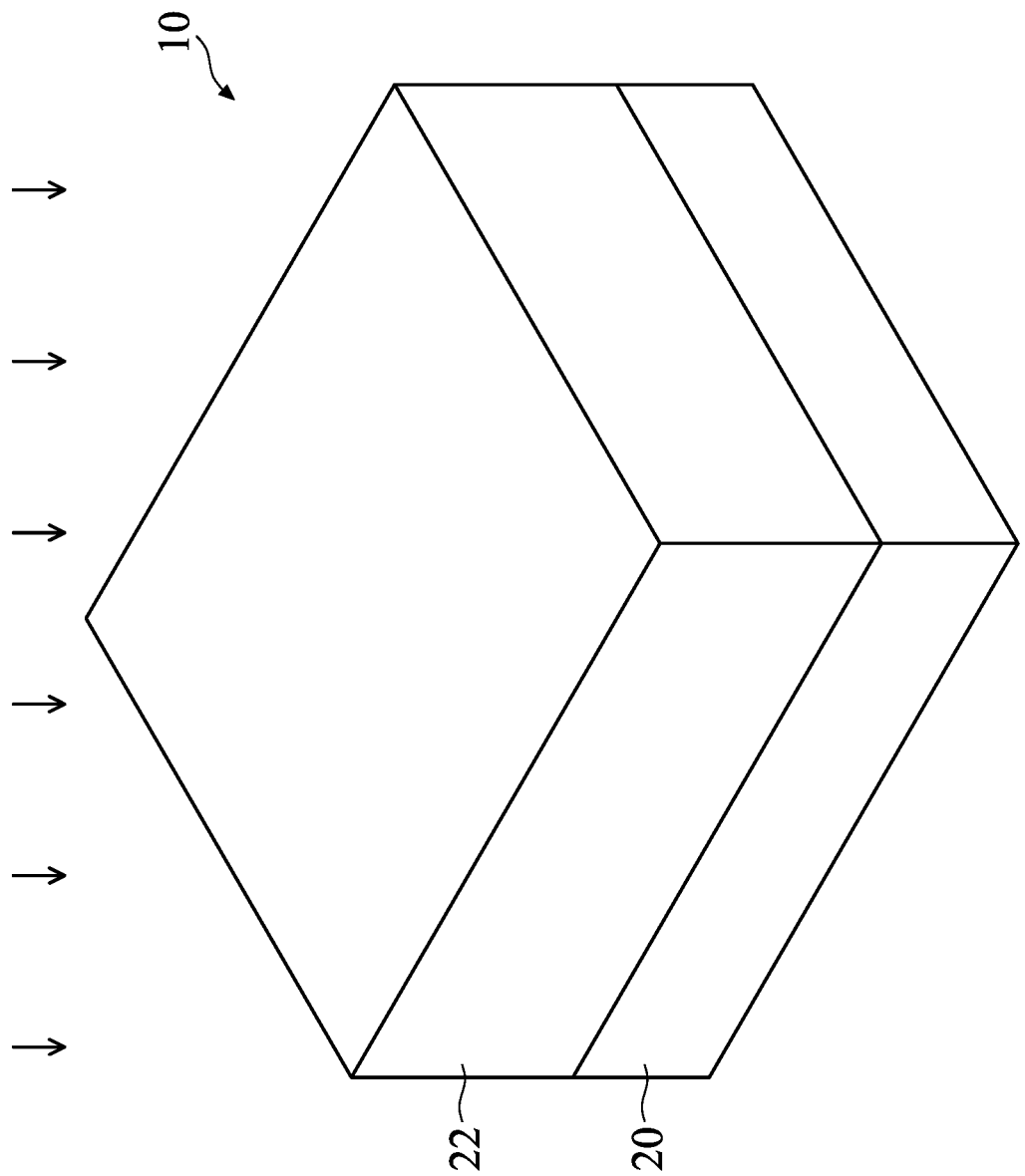
FIGS. 1-6, 7A, 7B, 8A, 8B, 9-19, 20A, and 20B illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with hybrid capping layers and the methods of forming the same are provided in accordance with some embodiments. A first low-resistivity conductive layer is formed over and contacting the recessed metal gate. The first low-resistivity conductive layer is used as a seed layer, so that a second low-resistivity conductive layer is formed selectively and reaches a desirable thickness. The low-resistivity conductive layers have resistivity values lower than the resistivity values of at least some layers in the metal gate, so that the overall gate resistance of the metal gate is reduced. The intermediate stages of forming the transistors are illustrated in accordance with some embodiments. Some variations of some embodiments are discussed. Throughout the various views and illustrative embodiments, like reference numbers are used to designate like elements. Although method embodiments may be discussed as being performed in a particular order, other method embodiments may be performed in any logical order. In accordance with embodiments, the formation of Fin Field-Effect Transistors (FinFETs) is used as an example to explain the concept of the present disclosure. Other types of transistors such as planar transistors may also adopt the concept of the present disclosure. In accordance with some embodiments of the present disclosure, a metal (replacement) gate is formed for a FinFET. The metal gate is then etched and recessed, so that a recess is generated.

FIGS. 1-6, 7A, 7B, 8A, 8B, 9-19, 20A, and 20B illustrate the cross-sectional views and perspective views of intermediate stages in the formation of FinFETs in accordance with some embodiments of the present disclosure. The processes shown in these figures are also reflected schematically in the process flow 200 shown in FIG. 23.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 23. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
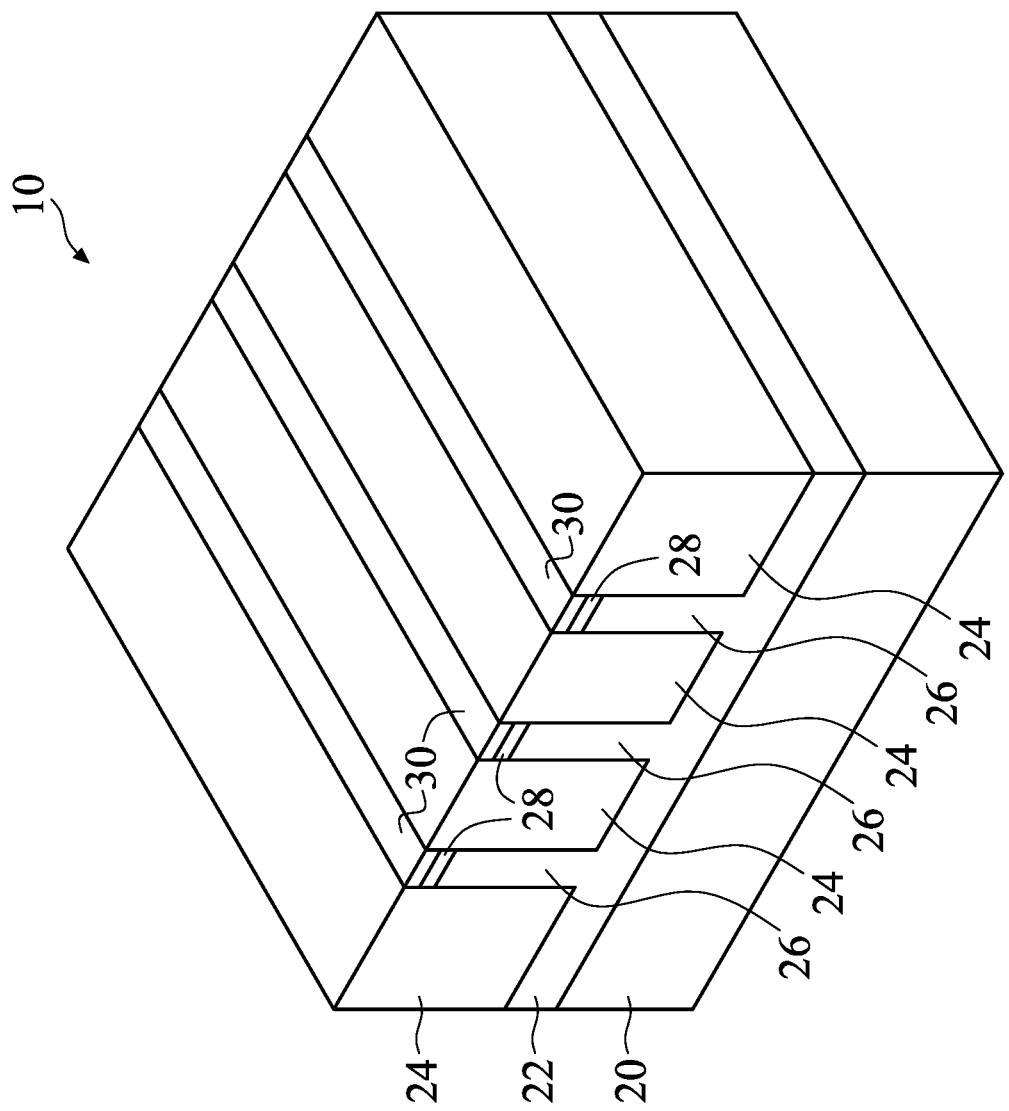

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material. Hard masks 30 are then removed.

Figure 3:
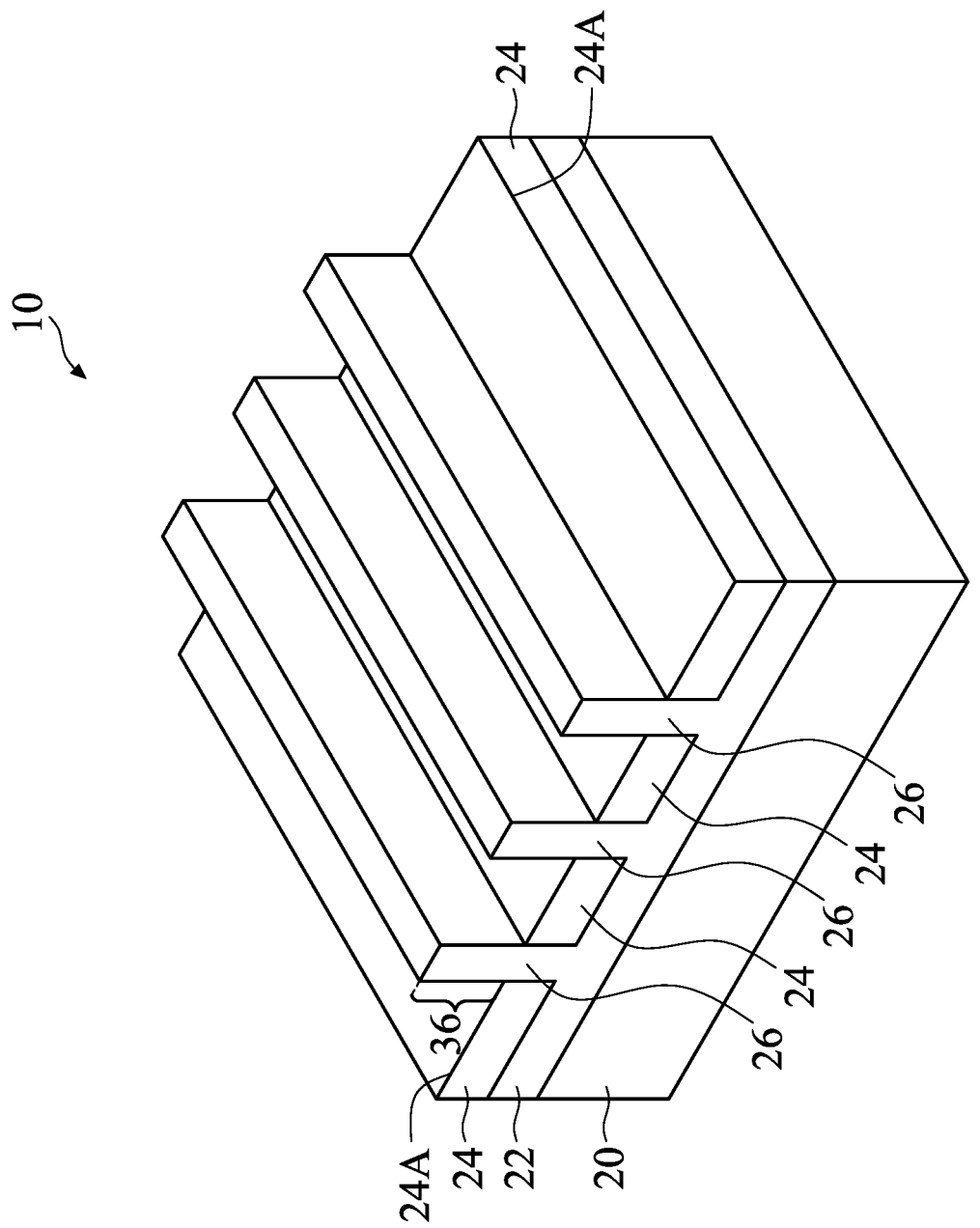

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 23. Pad oxides 28 are also removed. The etching may be performed using a dry etching process, wherein HF and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
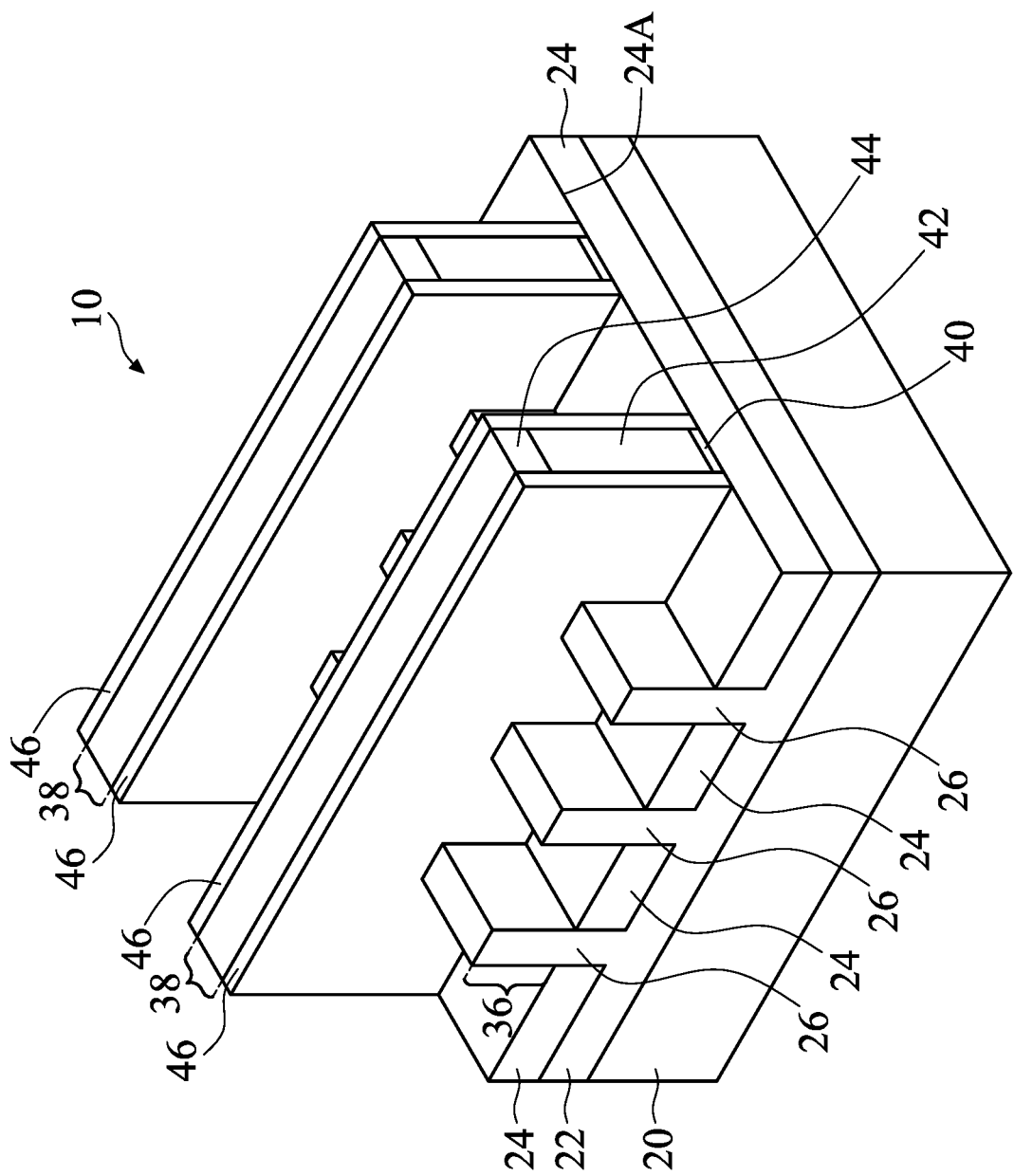

Referring to FIG. 4, dummy gate stacks 38 are formed to extend on the top surfaces and the sidewalls of (protruding) fins 36. The respective process is illustrated as process 208 in the process flow 200 shown in FIG. 23. Dummy gate stacks 38 may include dummy gate dielectrics 40 and dummy gate electrodes 42 over dummy gate dielectrics 40. Dummy gate dielectrics 40 may be formed of silicon oxide or like materials. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 23. In accordance with some embodiments of the present disclosure, gate spacers 46 are formed of a low-k dielectric material(s) such as porous silicon oxynitride, porous silicon carbo-nitride, porous silicon nitride, or the like, and may have a single-layer structure or a multi-layer structure including a plurality of dielectric layers. The dielectric constant (k value) of gate spacers 46 is lower than 3.8, and may be lower than about 3.0, for example, in the range between about 2.5 and about 3.0.

Figure 5:
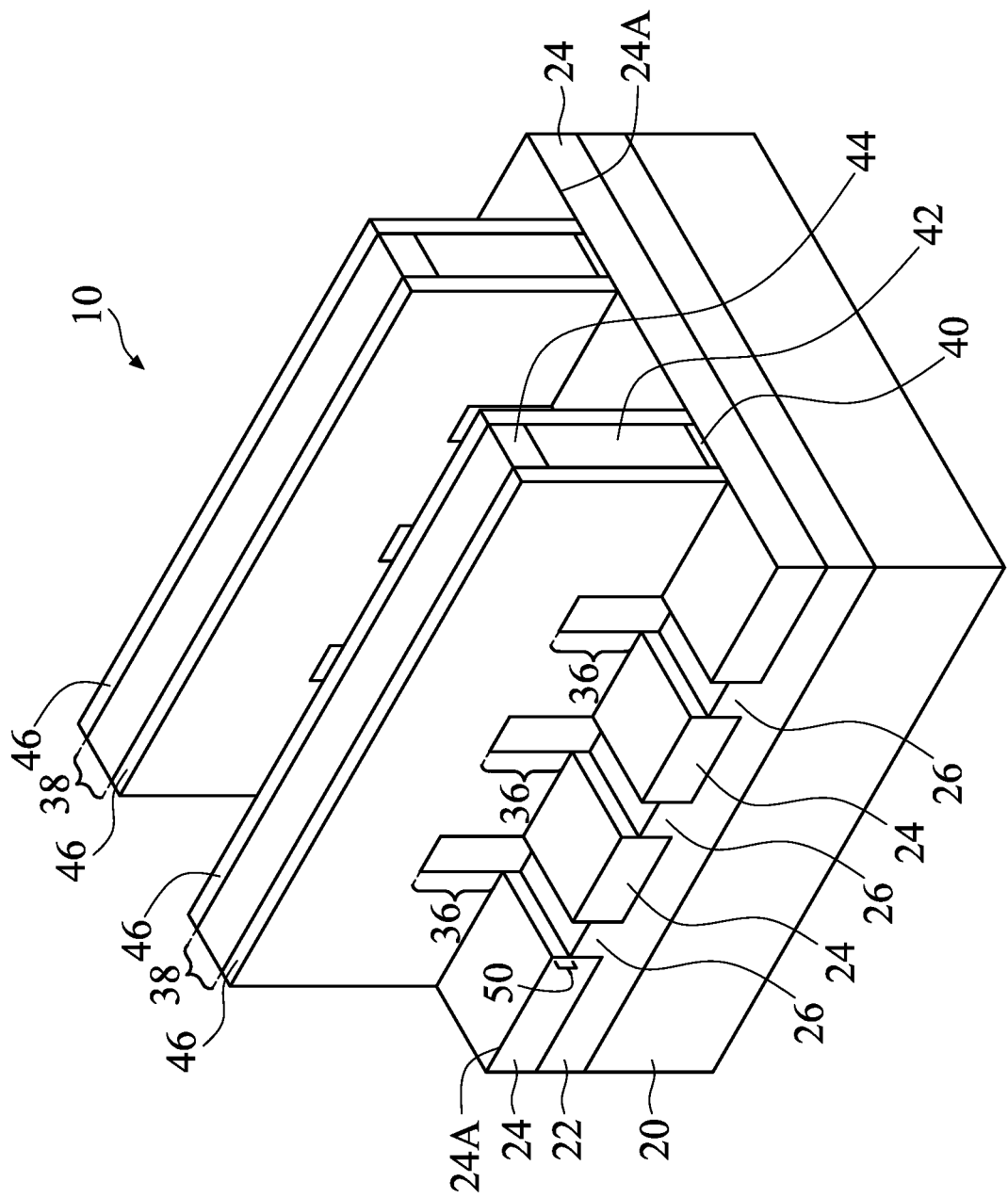

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
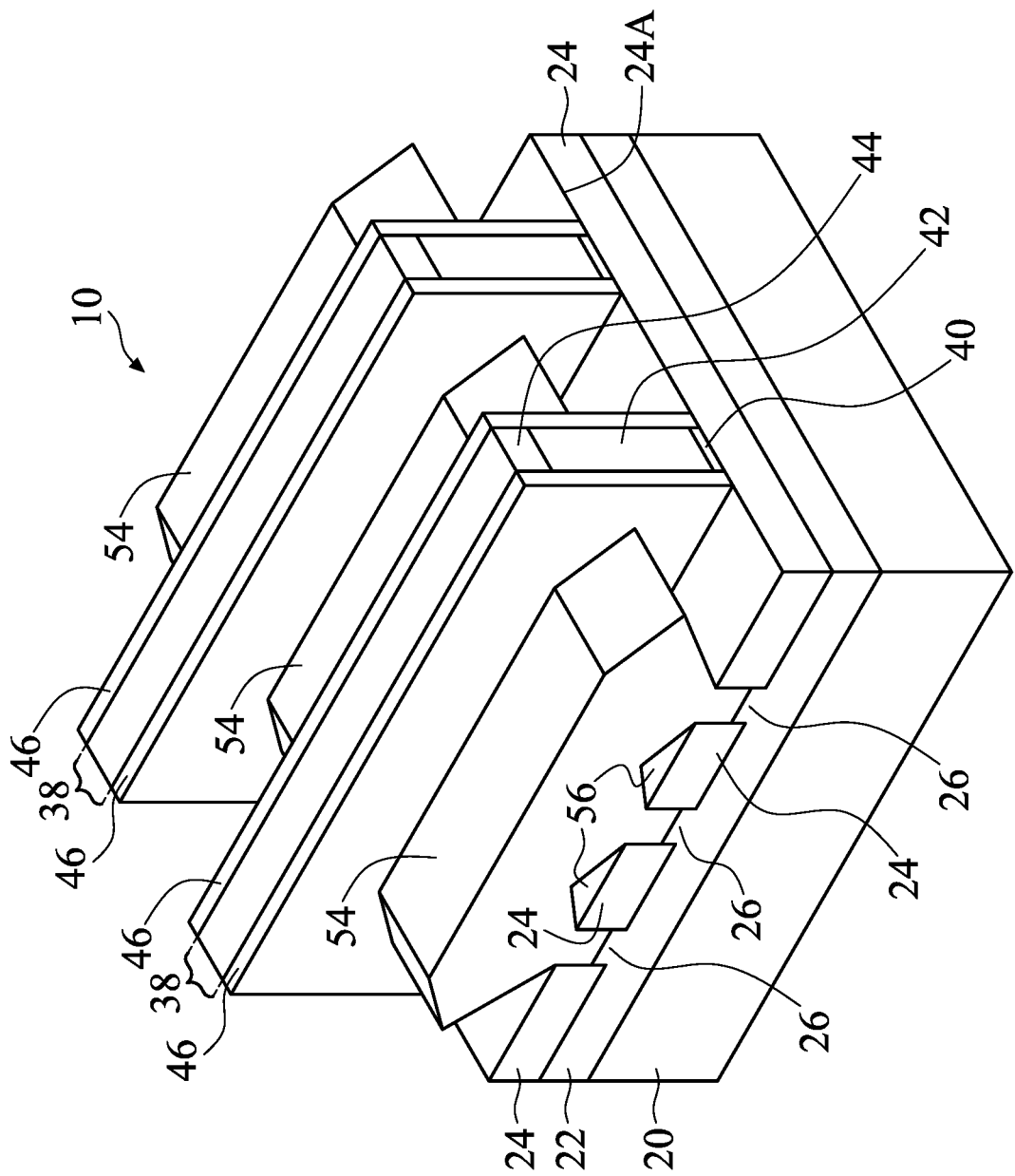

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
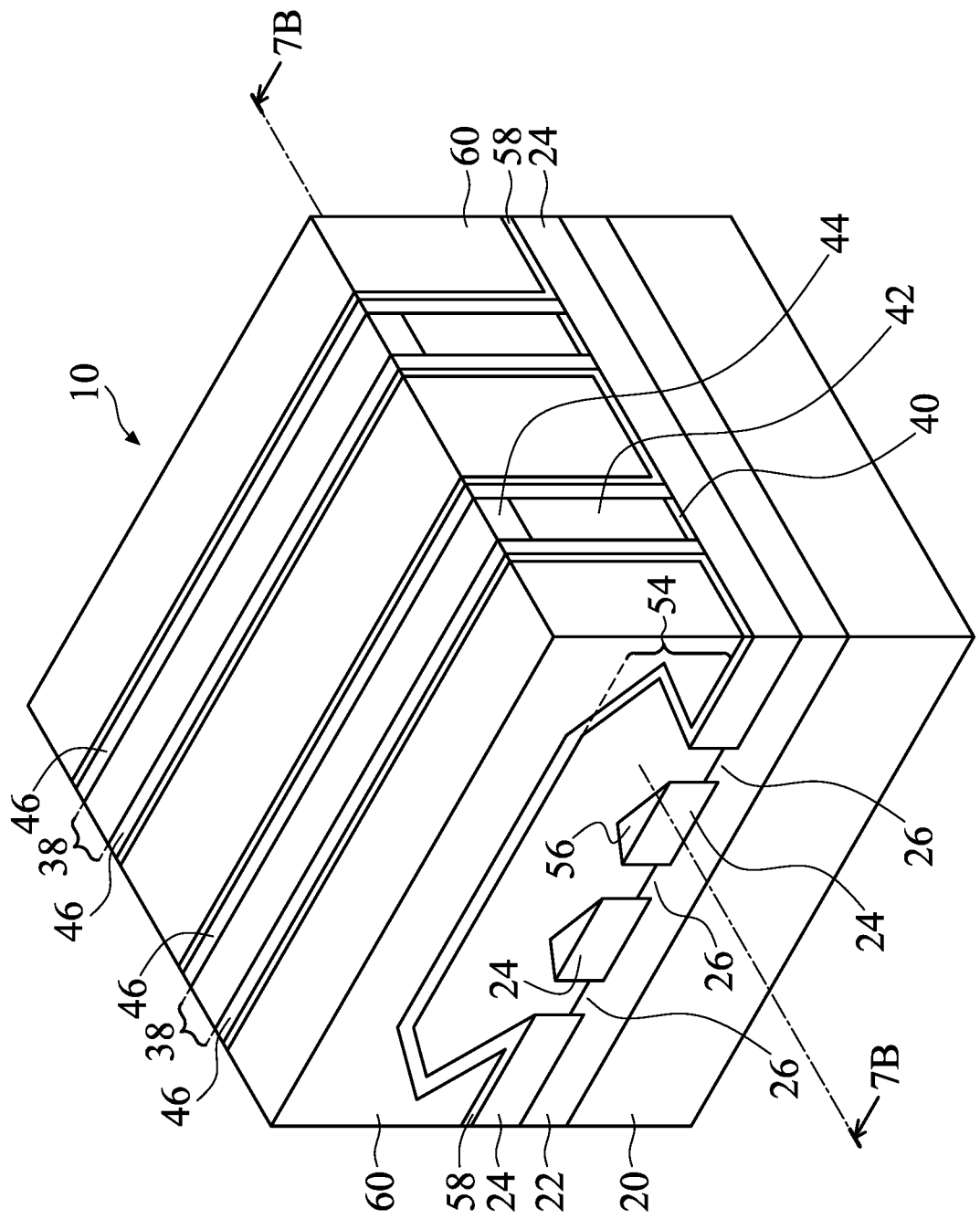
Figure 7B:
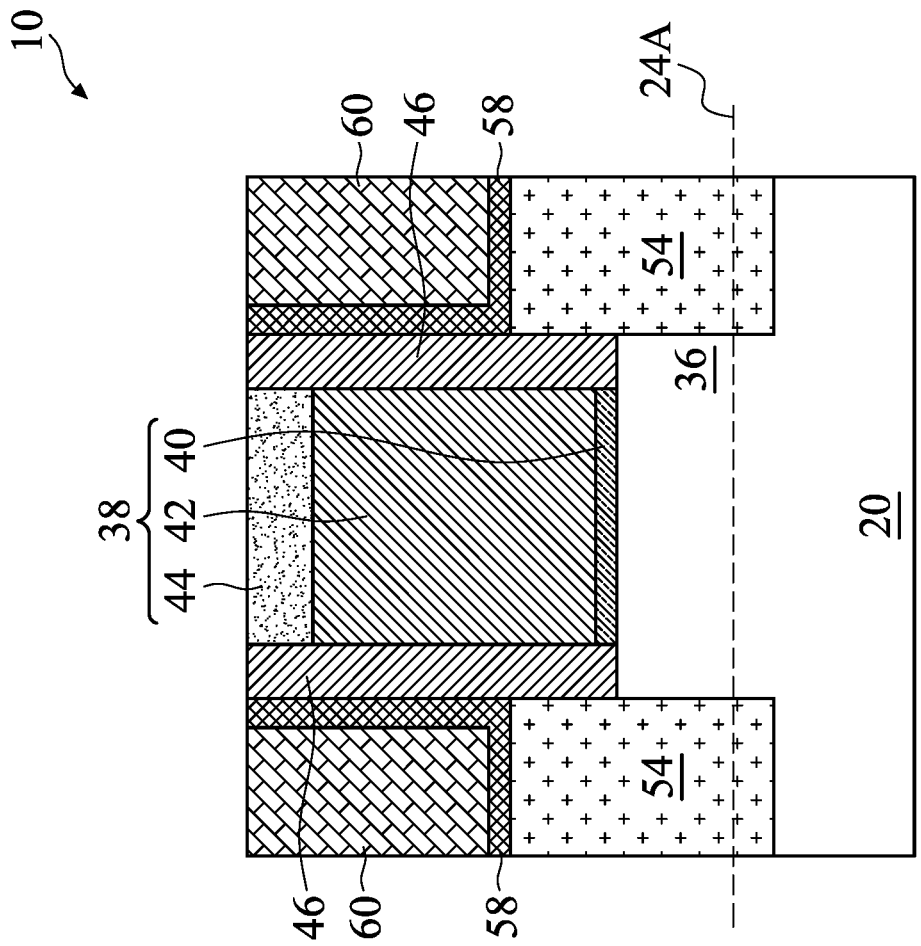

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 23. CESL 58 may be formed of silicon nitride, silicon oxide, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other. FIG. 7B illustrates the reference cross-section 7B-7B as shown in FIG. 7A in accordance with some embodiments, with one dummy gate stacks 38 illustrated.

After the structures shown in FIGS. 7A and 7B are formed, the dummy gate stacks 38 are replaced with metal gates and replacement gate dielectrics, as shown in FIGS. 8A, 8B and 9-12. In subsequent figures, the top surfaces 24A of STI regions 24 are illustrated to show the position of semiconductor fin 36, which protrudes higher than top surfaces 24A of STI regions 24.

Figure 8A:
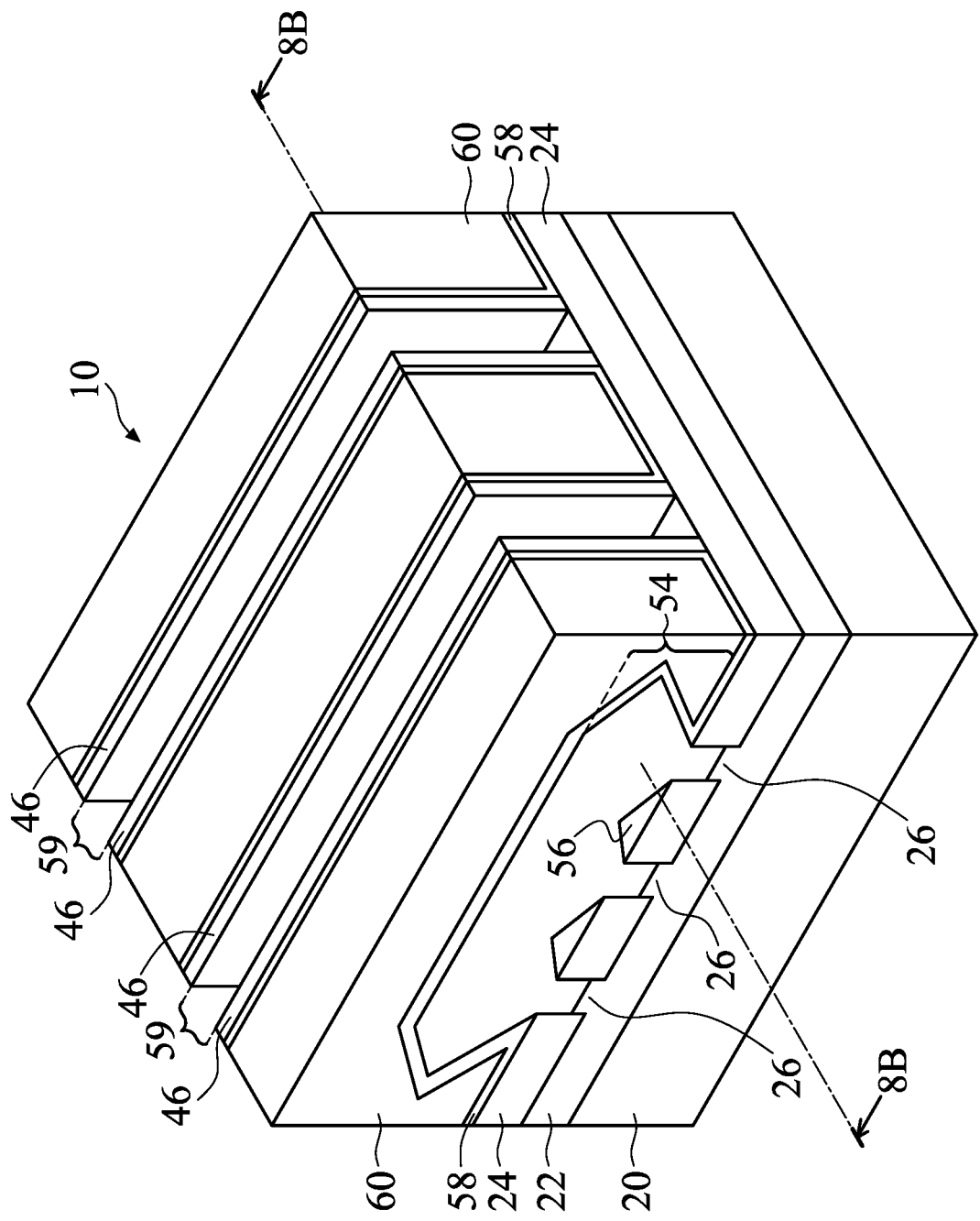
Figure 8B:
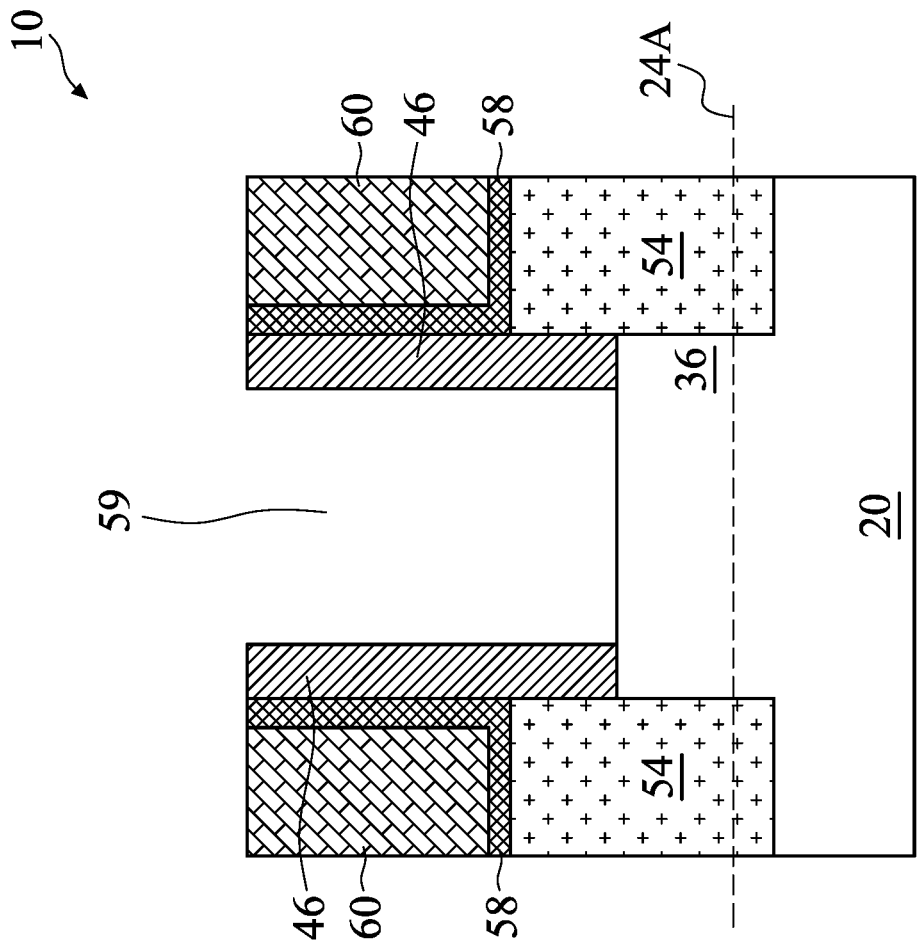

To form the replacement gates, hard mask layer 44, dummy gate electrode 42, and dummy gate dielectric 40 as shown in FIG. 7B are removed first, forming openings 59 as shown in FIGS. 8A and 8B. The respective process is illustrated as process 216 in the process flow 200 shown in FIG. 23. The top surface and the sidewalls of protruding fin 36 are exposed to openings 59.

Figure 9:
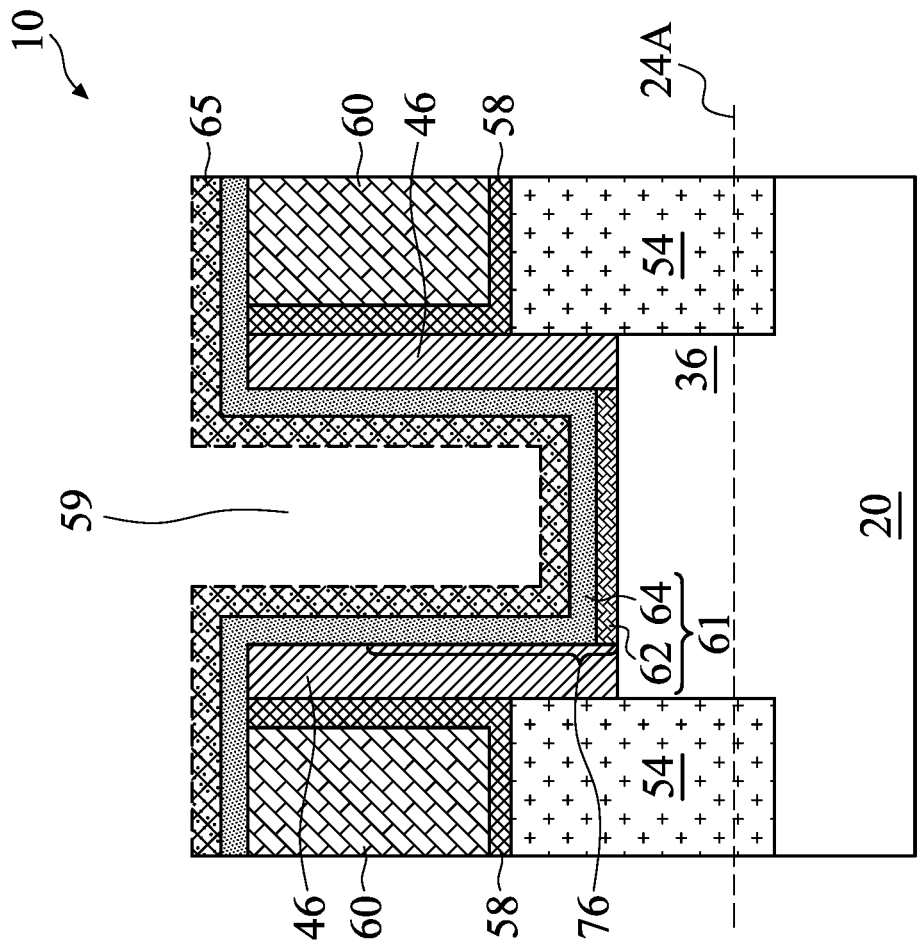

Next, referring to FIG. 9, gate dielectric 61 is formed, which extends into openings 59. The respective process is illustrated as process 218 in the process flow 200 shown in FIG. 23. In accordance with some embodiments of the present disclosure, gate dielectric 61 includes Interfacial Layer (IL) 62, which is formed on the exposed top surface and sidewall surfaces of protruding fin 36. ILs 62 may include an oxide layer such as a silicon oxide layer, which is formed through the thermal oxidation of a surface portion of protruding fin 36, a chemical oxidation process, or a deposition process. The gate dielectric 61 may also include high-k dielectric layer 64 over IL 62. High-k dielectric layer 64 may be formed of a high-k dielectric material such as hafnium oxide, lanthanum oxide, aluminum oxide, zirconium oxide, combinations thereof, multi-layers thereof, or the like. The dielectric constant (k-value) of the high-k dielectric material is higher than 3.9, and may be higher than about 7.0, and sometimes as high as 21.0 or higher. High-k dielectric layer 64 is overlying, and may contact, IL 62. High-k dielectric layer 64 is formed as a conformal layer, and extends on the sidewalls of protruding fin 36 and the top surface and the sidewalls of gate spacers 46. In accordance with some embodiments of the present disclosure, high-k dielectric layer 64 is formed using ALD, CVD, or the like.

Figure 23:
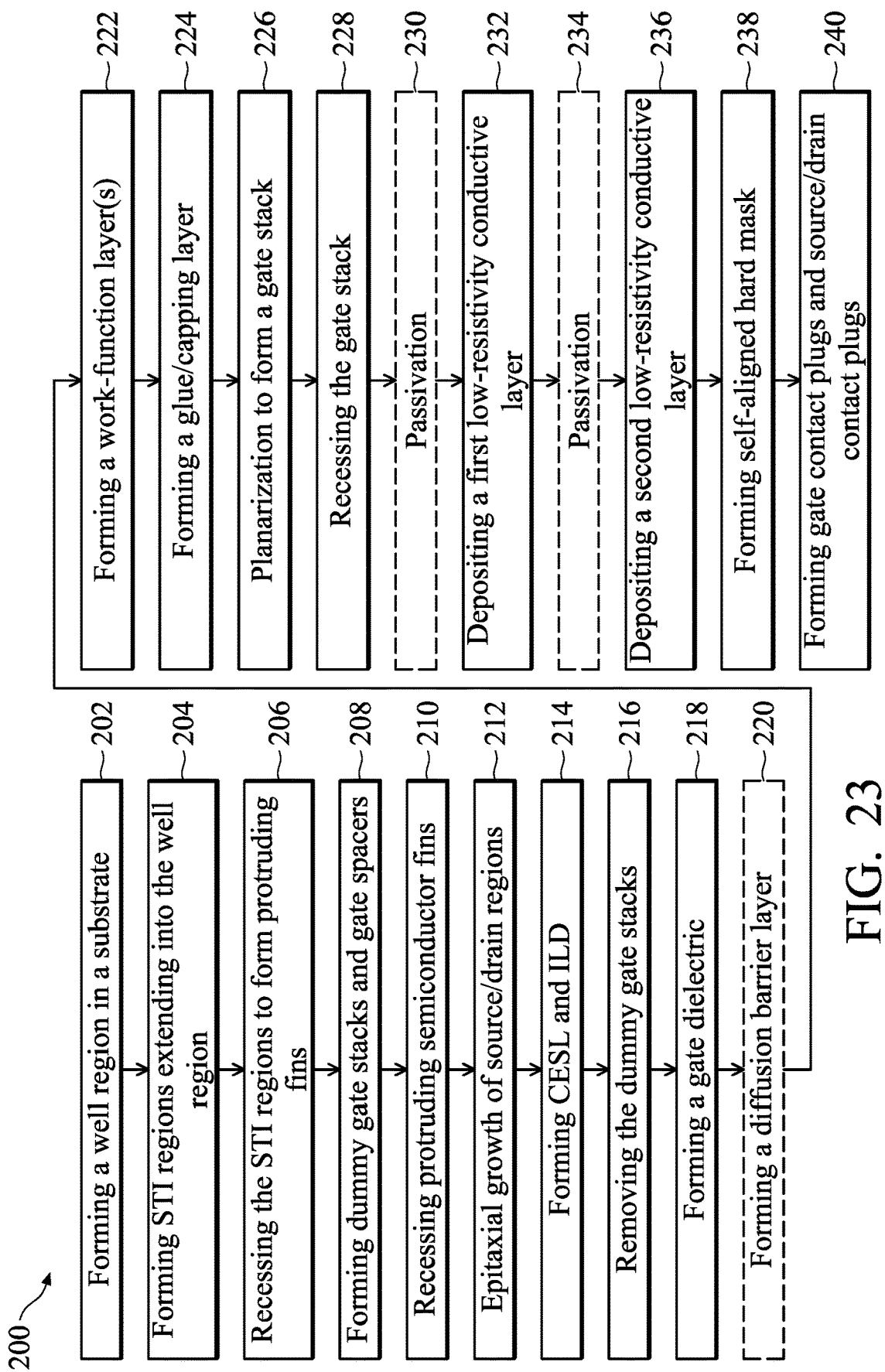
FIG. 23 illustrates a flow chart of a process flow for forming a FinFET in accordance with some embodiments.

In accordance some embodiments, an adhesion layer (which is also a diffusion barrier layer) 65 is formed over high-k dielectric layer 64. The respective process is illustrated as process 220 in the process flow 200 shown in FIG. 23. Adhesion layer 65 may be formed of TiN or Titanium Silicon Nitride (TSN). The TiN layer may be formed using ALD or CVD, and the TSN layer may include alternatingly deposited TiN layers and SiN layers, which are formed using ALD, for example. Since the TiN layers and SiN layers are very thin, these layers may not be able to be distinguished from each other, and are hence referred to as a TSN layer. In accordance with alternative embodiments, adhesion layer 65 is not formed, and the subsequently formed work-function layer is in contact with high-k dielectric layer 64. Accordingly, the process 220 in FIG. 23 is shown using a dashed box to indicate it may be performed or may be skipped. In subsequent figures, adhesion layer 65 is not shown, while it may or may not be formed.

Figure 10:
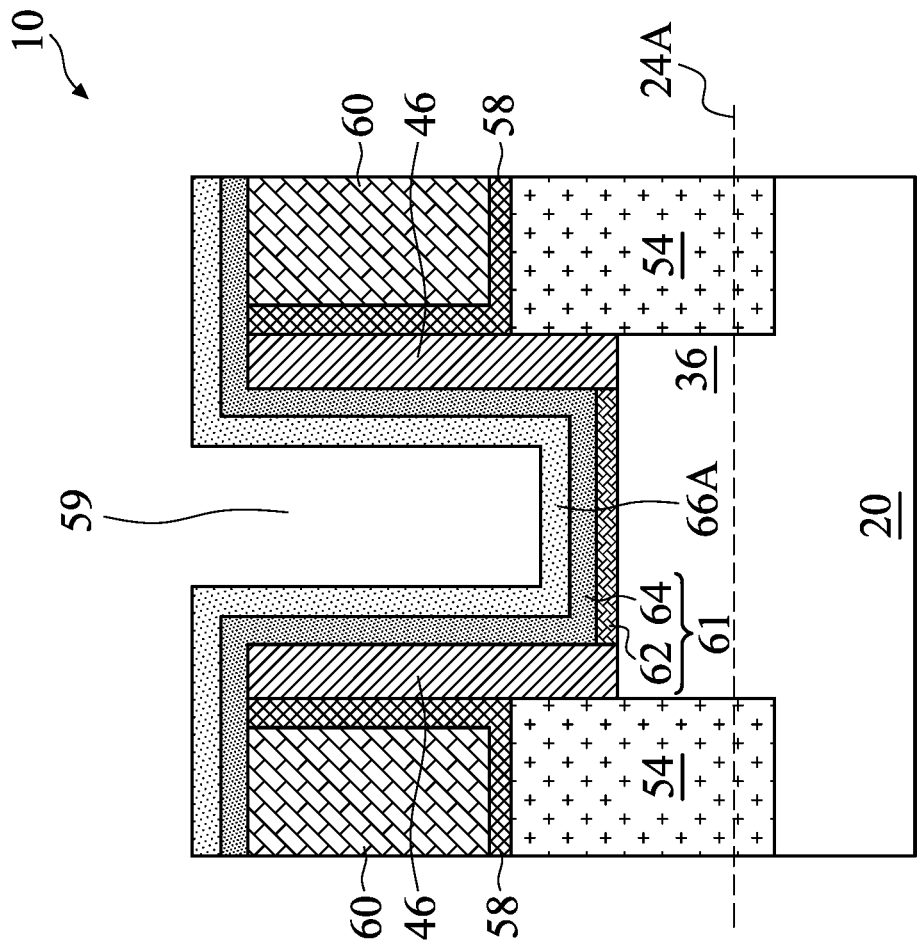
Figure 11:
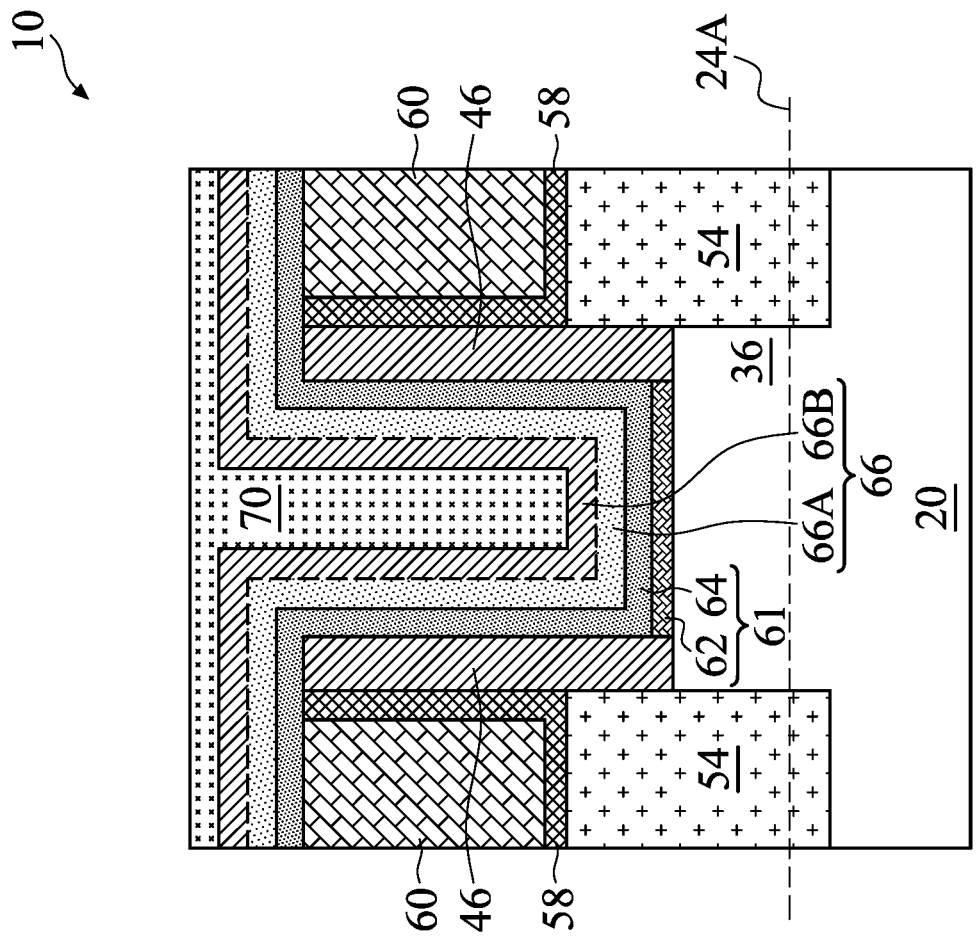

Referring to FIGS. 10 and 11, work-function layer 66 is formed through deposition. The respective process is illustrated as process 222 in the process flow 200 shown in FIG. 23. Work-function layer 66 includes at least one homogeneous layer (such as sub layer 66A in FIG. 10) having an entirety formed of a same material, or may include a plurality of sub layers formed of materials different from each other. The materials of the layer(s) in work-function layer 66 may be selected according to whether the respective FinFET formed is an n-type FinFET or a p-type FinFET. For example, when the FinFET is an n-type FinFET, work-function layer 66 may include an n-work-function layer, which may be Al-based layer (formed of, for example, TiAl, TiAlN, TiAlC, TaAlN, TaAl, TaAlC, or the like), or multi-layers thereof. If the adhesion layer 65 is not formed, a titanium nitride (TiN) layer (not shown) may or may not be formed between (and contacting) the n-work-function layer and high-k dielectric layer 64 to tune the work function. When the FinFET is a p-type FinFET, the corresponding work-function layer 66 may include a p-work-function layer such as a TiN layer, a tungsten carbon nitride (WCN) layer, or the like.

In accordance with some embodiments, work function layer 66 may include sub layer 66A and sub layer 66B, as shown in FIG. 11. For example, a work function layer 66 of an n-type FinFET may include an n-work-function layer (represented as 66A) and a p-work-function layer (represented as 66B) over the n-work-function layer, wherein the n-work-function layer dominates the work function of the respective FinFET, and the p-work-function layer is formed simultaneously when the p-work-function layer is formed for a p-type FinFET.

In accordance with alternative embodiments, as shown in FIG. 11, a work function layer of a p-type FinFET may also include a p-work-function layer (represented as 66A) and an n-work-function layer (represented as 66B) over the p-work-function layer, wherein the p-work-function layer dominates the work function of the respective FinFET, and the n-work-function layer is formed simultaneously when the n-work-function layer is formed for an n-type FinFET. In subsequent example figures, both work function layers 66A and 66B are shown, while a single work function layer may be used instead in accordance with some embodiments.

In accordance with some embodiments of the present disclosure, blocking layer 70 (which is an adhesion layer) is formed over work-function layer 66. The respective process is illustrated as process 224 in the process flow 200 shown in FIG. 23. Blocking layer 70 may be a metal-containing layer, which may be formed of TiN in accordance with some embodiments. Other materials such as TaN may also be used. In accordance with some embodiments, blocking layer 70 is formed using ALD, CVD, or the like. In accordance with some embodiments, glue layer 70 fully fills the remaining opening 59 (FIG. 8B). In accordance with alternative embodiments, a gap-filling process is performed to fill the remaining opening 59 with a filling metal, which may be formed of tungsten, cobalt, or the like.

Figure 12:
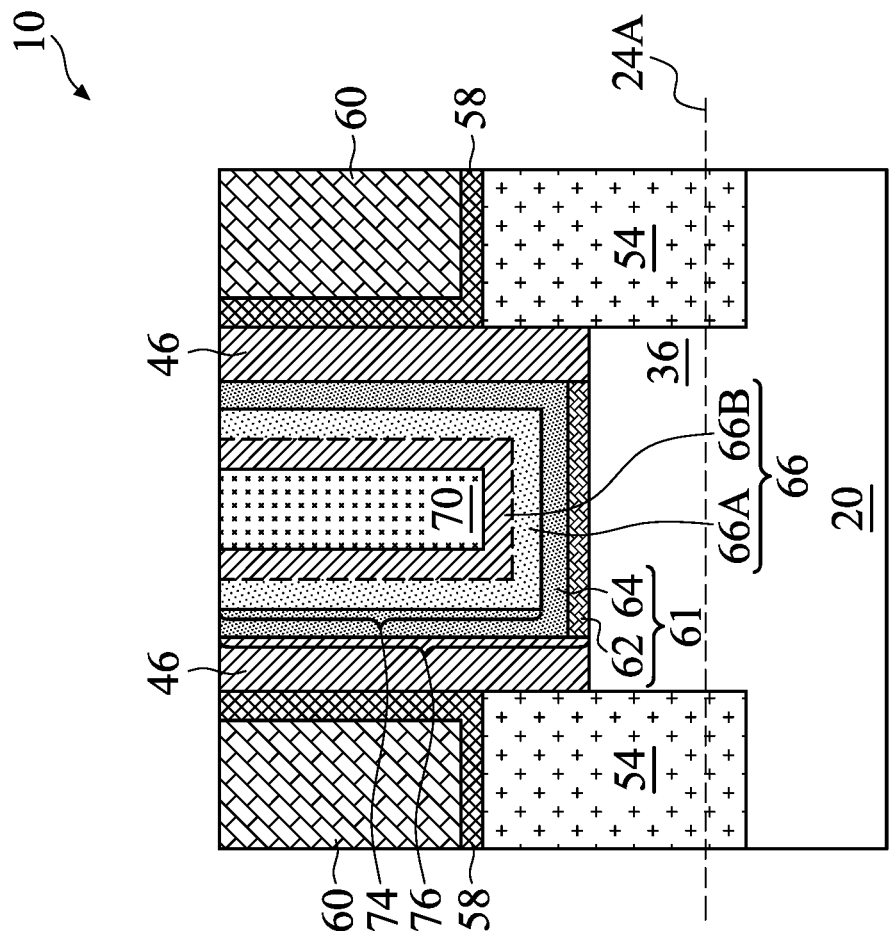

After opening 59 is fully filled, a planarization process such a Chemical Mechanical Polish (CMP) process or a mechanical polish process is performed to remove excess portions of the deposited layers as shown in FIG. 11, resulting in the gate stack 76 as shown in FIG. 12. The respective process is illustrated as process 226 in the process flow 200 shown in FIG. 23. Gate stack 76 includes gate dielectric 61 and gate electrode 74.

Figure 13:
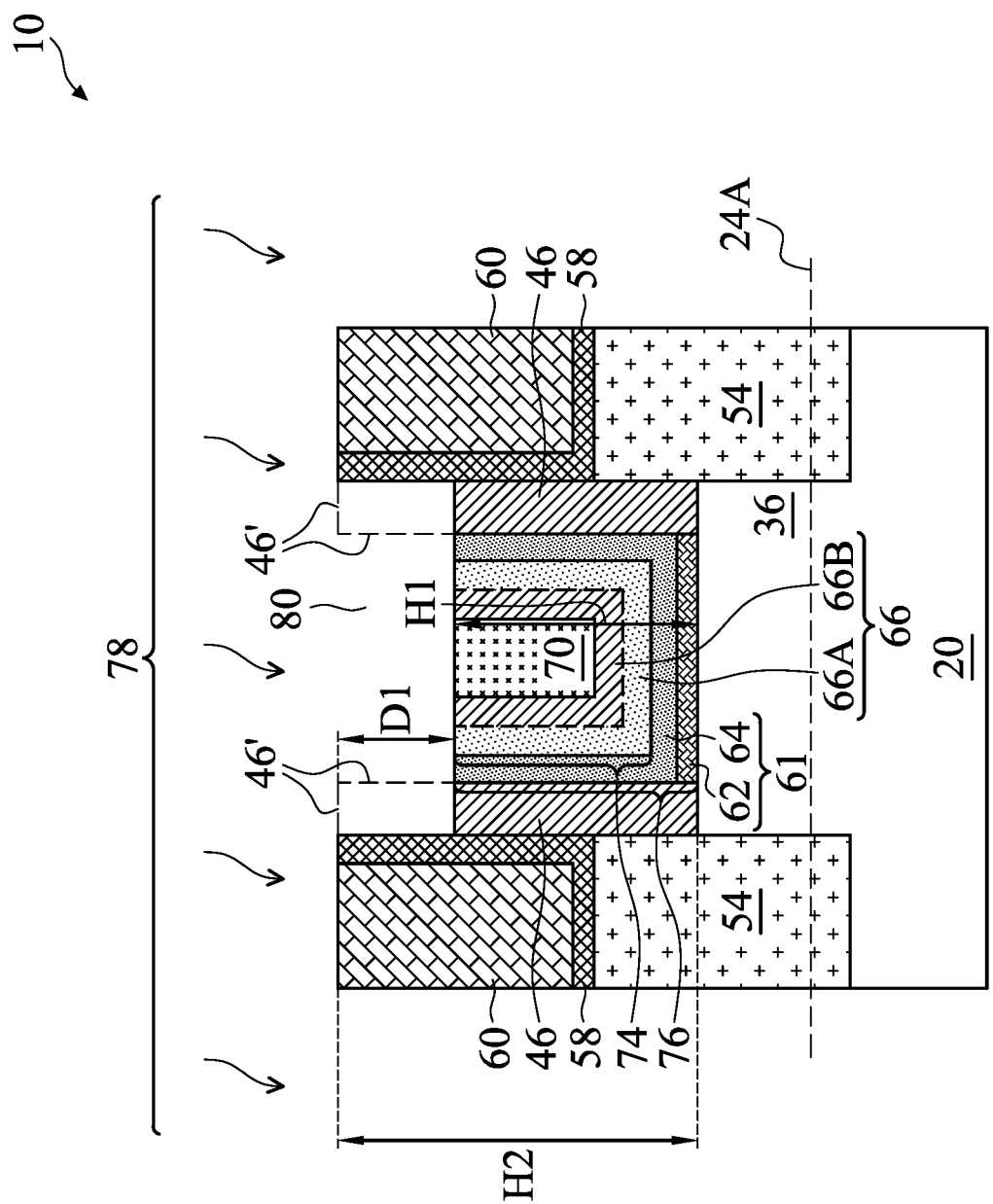
Figure 14:
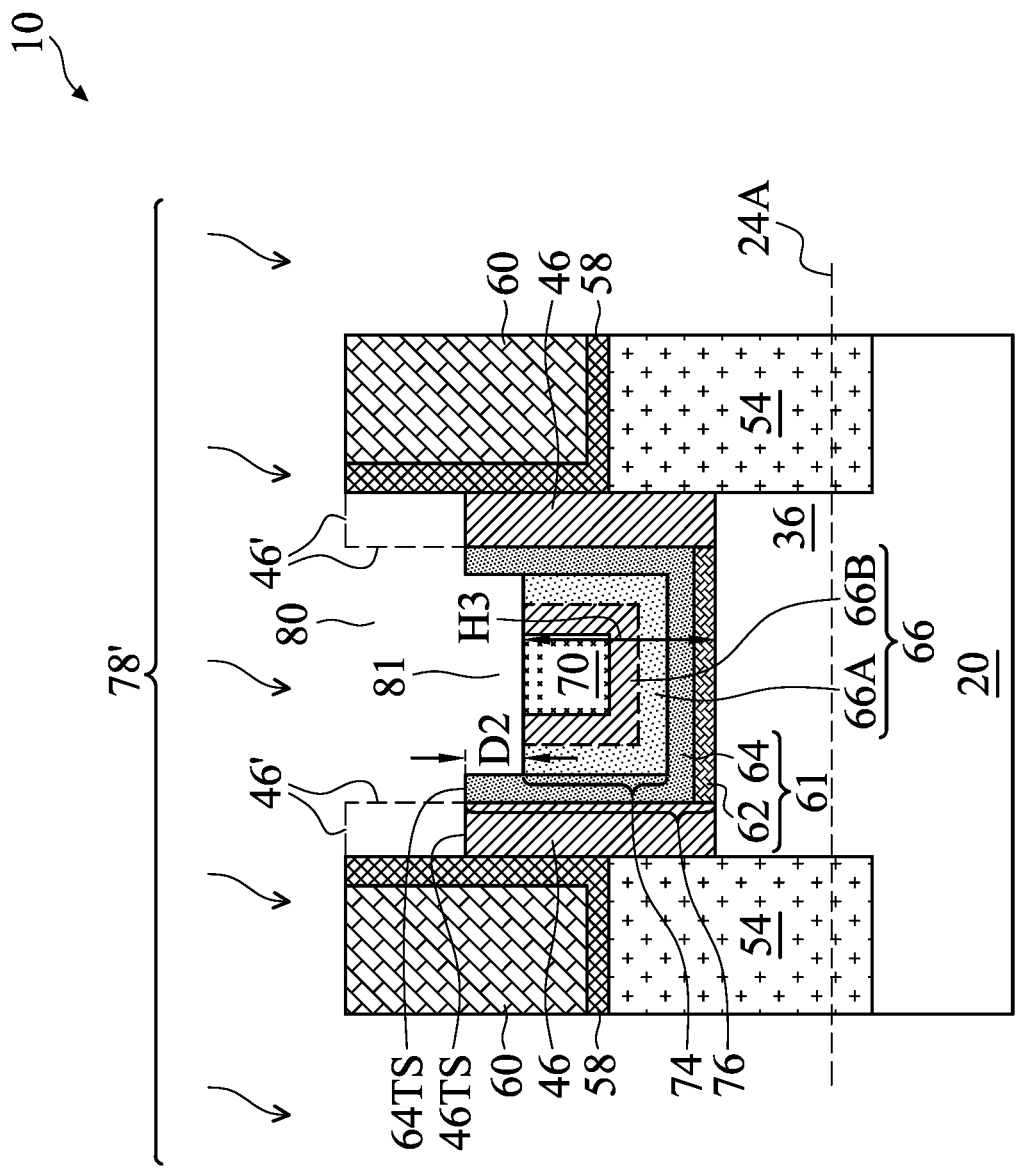

FIGS. 13 and 14 illustrate the processes for recessing gate stack 76. The respective process is illustrated as process 228 in the process flow 200 shown in FIG. 23. FIG. 13 illustrates a first etch-back process 78 performed on gate stack 76 and gate spacers 46, wherein the etching is represented by arrows. Recess 80 is generated accordingly. The first etch-back process may include a dry etch process and/or a wet etch process. Furthermore, the etching may be isotropic or anisotropic. In accordance with some embodiments of the present disclosure, the first etch-back process is performed using an etchant that etches gate spacers 46 and gate stack 76, and does not etch CESL 58 and ILD 60. In accordance with some embodiments when a dry etching process is used, the etching gases includes a fluorine-based etchant such as $CF_4$, $C_2F_6$, $NF_3$, or the like, or combinations thereof. In accordance with some embodiments when a wet etching process is used, the etching chemical may include diluted HF solution, $NH_4OH$ (ammonia solution), or combinations thereof. In accordance with some embodiments, after the first etch-back process, the height of gate stacks 76 is H1, which may be in the range between about 10 nm and about 40 nm. The vertical distance from the top surface of protruding fins 36 to the top surface of ILD 60 is represented as H2. The ratio H1/H2 may be in the range between about ⅓ and about ½. The recessing depth D1 may be in the range between about 50 nm and about 80 nm. It is appreciated that the value of recessing depth D1 cannot be too high or too low. If the value is too high, some parts (such as the parts directly over protruding fin 36) of gate stack 76 may be adversely removed, causing device failure. If the value is too low, not enough recess is generated to accommodate the self-aligned hard mask in subsequent processes.

In accordance with some embodiments as shown in FIG. 13, gate spacers 46 are recessed by the first etch-back process 78. In accordance with alternative embodiments, gate spacers 46 are not recessed by the first etch-back process 78, wherein dashed lines 46' are illustrated to show the top portions of gate spacers 46 that remain after the first etch-back process.

After the first etch-back process as shown in FIG. 13, a second etch-back process 78' may be performed, as shown in FIG. 14. Recess 81 is thus formed between the opposing portions of the corresponding high-k dielectric layer 64. The second etch-back process 78' is performed using an etching gas or an etching chemical solution different from that is used in the first etch-back process 78. The second etch-back process 78' may include a dry etch process and/or a wet etch process. Furthermore, the etching may be isotropic or anisotropic. In accordance with some embodiments of the present disclosure, the second etch-back process is performed using an etchant that etches gate electrode 74, and does not etch gate spacers 46, high-k dielectric layer 64, CESL 58, and ILD 60. In accordance with some embodiments when a dry etching process is used, the etching gases may include $BCl_3$, $Cl_2$, $WF_6$, or combinations thereof. In accordance with some embodiments in which a wet etching process is used, the etching chemical may include $NH_4OH$ or the like. In accordance with some embodiments, the recessing depth D2 may be in the range between about 4 nm and about 8 nm. It is appreciated that the value of recessing depth D2 also cannot be too high or too low. If the value is too high, some parts of gate electrode 74 may be adversely removed, causing device failure. If the value is too low, not enough recess is generated to accommodate the subsequent filling of low-resistivity conductive layers. In accordance with some embodiments, the height H3 of gate stack 76 after the second etch-back process 78' is in the range between about 5 nm and about 30 nm.

Due to the selectivity of the etchant on different materials, the top surface 46TS of gate spacers 46 may be level with, higher than, or lower than, the top surfaces 64TS of high-k dielectric layer 64.

Figure 15:
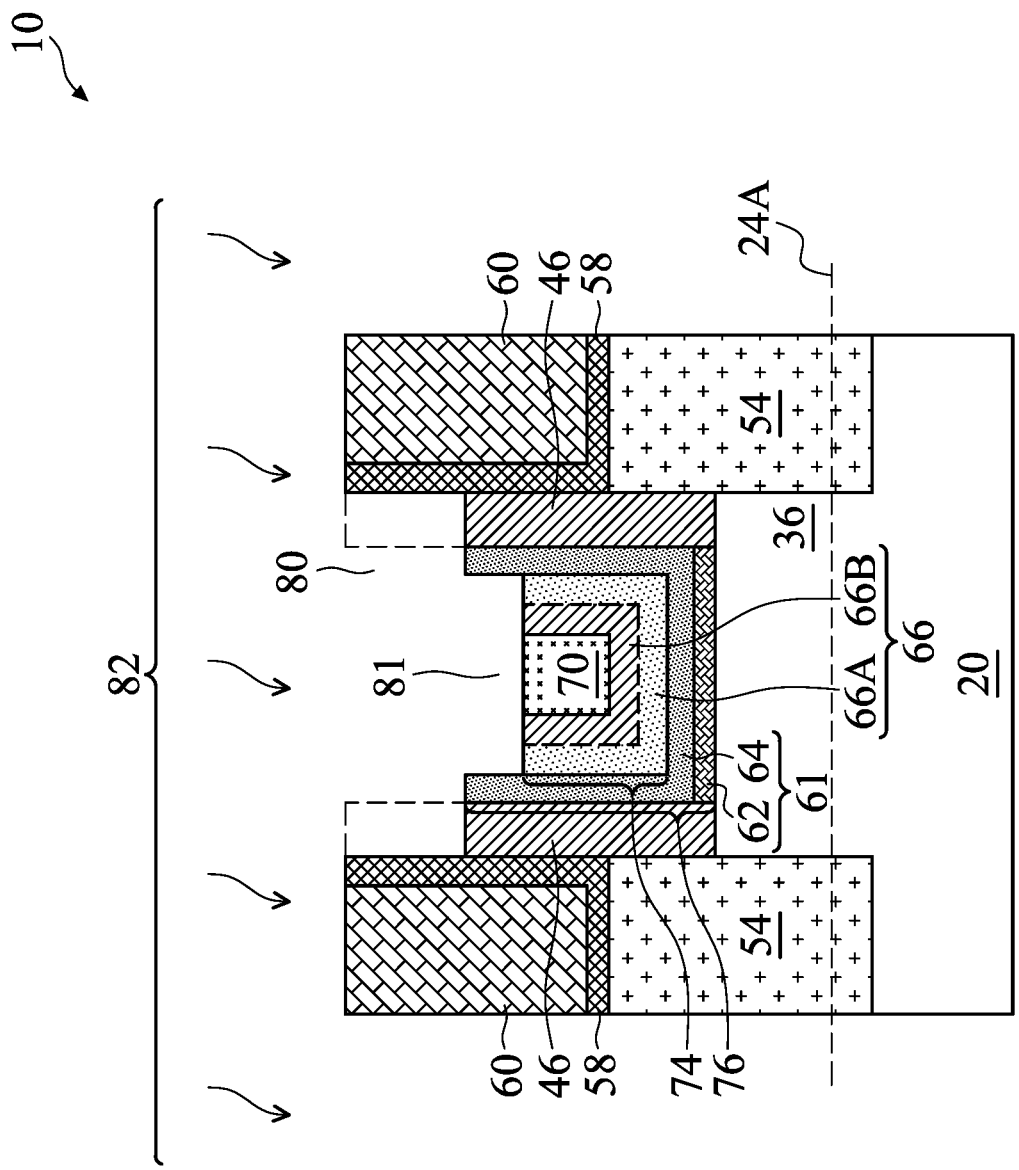
Figure 20A:
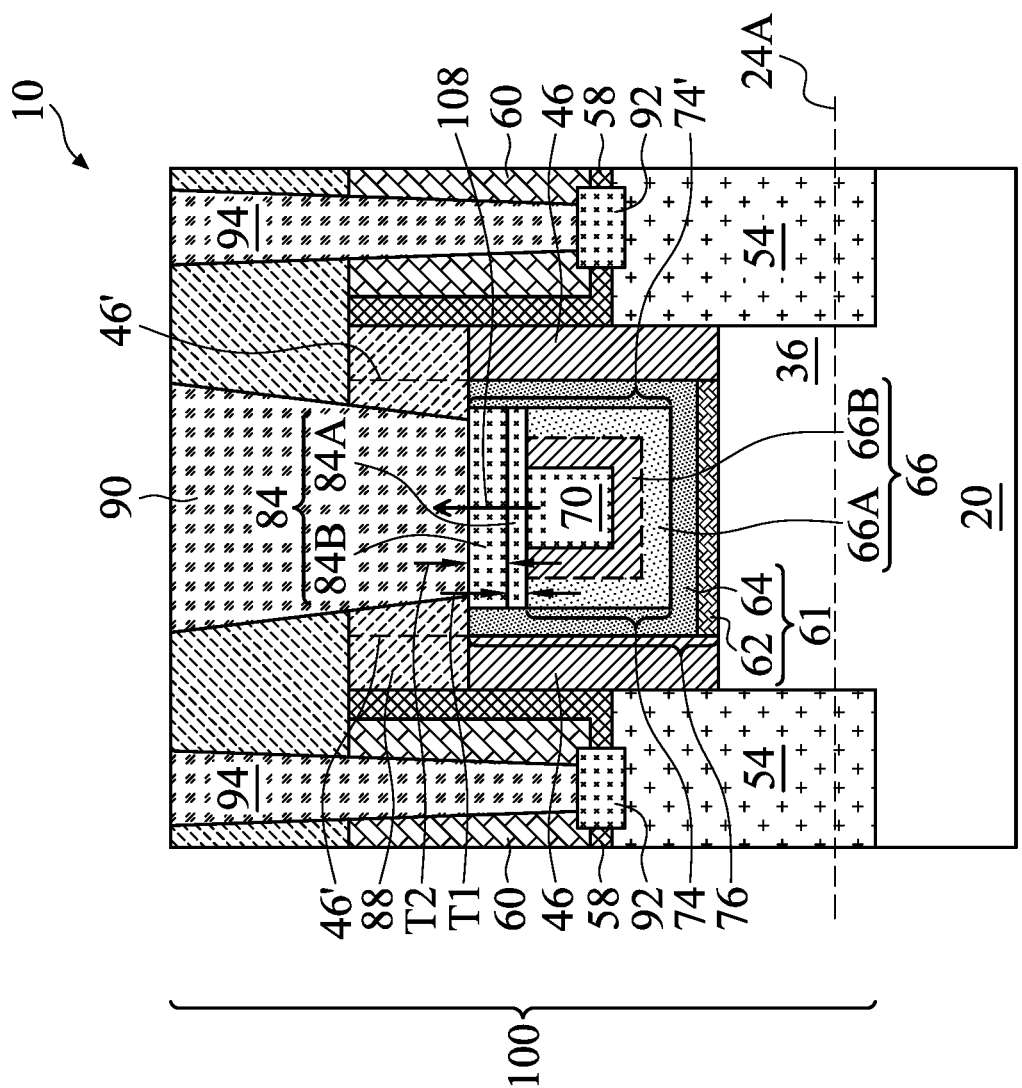

FIG. 15 illustrates a passivation process 82 performed in accordance with some embodiments. The respective process is illustrated as process 230 in the process flow 200 shown in FIG. 23. In accordance with some embodiments when dry etching is used in the etching processes 78 and 78', the material of gate electrode 74 may be re-sputtered onto high-k dielectric layer 64, gate spacers 46, CESL 58, and ILD 60. This may result in some problems. For example, the re-sputtered materials become the seed layer for the subsequently selectively deposited low-resistivity layers 84A and 84B (FIG. 18), causing low-resistivity layers 84A and 84B to be grown to undesirable places. Also, these materials may cause the electrical shorting between gate electrode 74 and other conductive features such as contact plugs 94 (FIG. 20A). Accordingly, a passivation process is performed to improve selectivity in the subsequent deposition processes, and to convert the re-sputtered materials (if any) into dielectric materials. In accordance with other embodiments, passivation process 82 is skipped when the re-sputter is not severe enough to affect the selectivity in deposition. Accordingly, passivation process 230 is illustrated using a dashed box in FIG. 23.

In accordance with some embodiments, the passivation process 82 is performed by annealing wafer 10 in an oxygen ($O_2$) containing environment, or performing a plasma treatment on wafer 10 using $O_2$ as a process gas. In accordance with some embodiments, the oxygen annealing is performed at a temperature in the range between about 200° C. and about 350° C., for a period of time, for example, in a range between about 10 secs and about 60 seconds. As a result, a surface layer of gate electrode 74 and the re-sputtered material will be oxidized to form an oxide. In accordance with alternative embodiments, the passivation process 82 is performed by treating wafer 10 in a nitrogen ($N_2$) and hydrogen ($H_2$) containing environment. As a result, a surface layer of gate electrode 74 and the re-sputtered material will be converted into a nitride. It is appreciated that gate electrode 74 may already comprise a metal nitride, and the nitriding will still improve selectivity because the damaged sidewall of SiN is passivated, and also the metal residue is passivated, so that the selectivity is improved. In accordance with yet alternative embodiments, the passivation process 82 is performed by thermal-soaking wafer 10 in an $NF_3$ containing environment, or performing a plasma treatment on wafer 10 using $NF_3$ as a process gas. In accordance with some embodiments, the thermal soaking is performed at a temperature in the range between about 250° C. and about 400° C., for a period of time, for example, in a range between about 1 minute and about 10 minutes.

Figure 16:
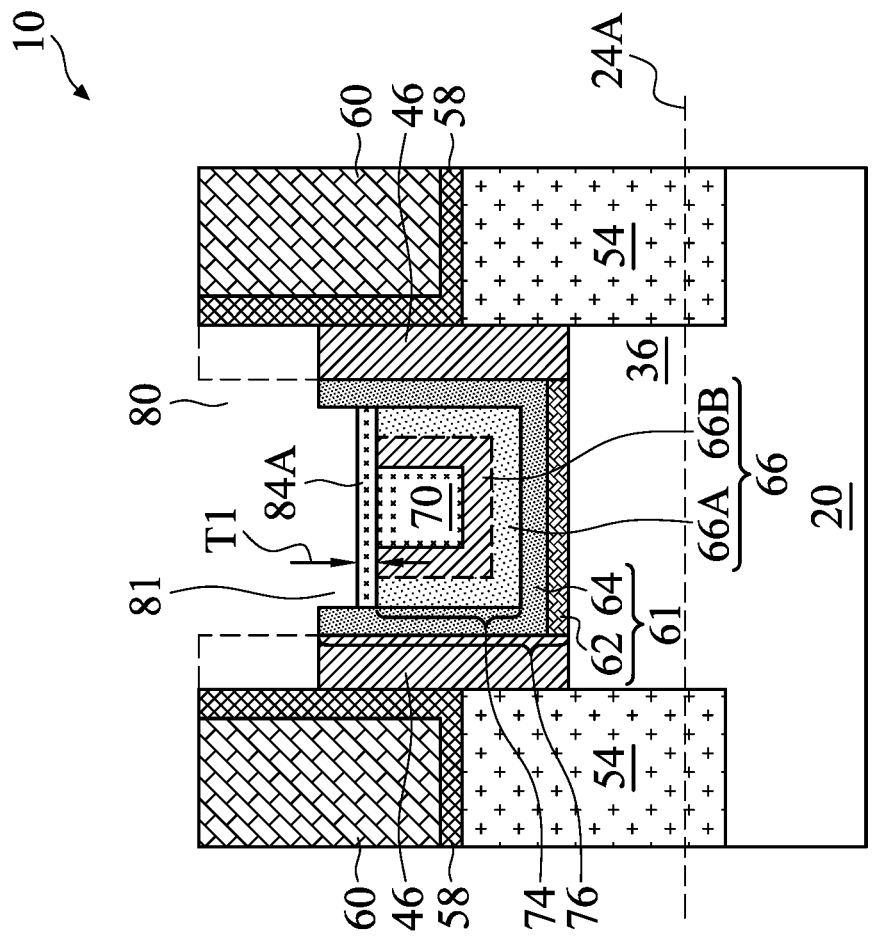

Referring to FIG. 16, a first low-resistivity conductive layer 84A, which may be a metal layer, is formed using a selective deposition process. Low-resistivity conductive layer 84A is also referred to as bottom sub (metal) layer 84A hereinafter. The respective process is illustrated as process 232 in the process flow 200 shown in FIG. 23. Throughout the description, bottom sub layer 84A may also be considered as parts of the respective gate electrodes. In accordance with some embodiments of the present disclosure, bottom sub layer 84A is formed of tungsten (W). The resistivity of the bottom sub layer 84A may be lower than the resistivity of the layers (which include layers 66 and 70) in gate electrode 74. Bottom sub layer 84A is formed on gate electrode 74, and not on the exposed surfaces of dielectric materials including gate spacers 46, high-k dielectric layer 64, CESL 58, and ILD 60. In accordance with some embodiments, the deposition is performed using ALD. The precursor may include $WCl_5$ and a reducing agent such as $H_2$. The deposition process includes a plurality of ALD cycles, each including conducting $WCl_5$, purging $WCl_5$, conducting $H_2$, and purging $H_2$. The deposition process may be performed at an elevated temperature, such as in the range between about 400° C. and about 500° C.

It is appreciated that $WCl_5$ has the function of etching metal oxides. Accordingly, if the first passivation process 82 is performed using oxygen, the resulting metal oxide formed due to the oxidation of the surface layer of gate electrode 74 and the re-sputter material of gate electrode 74 are etched before bottom sub layer 84A is grown.

Figure 17:
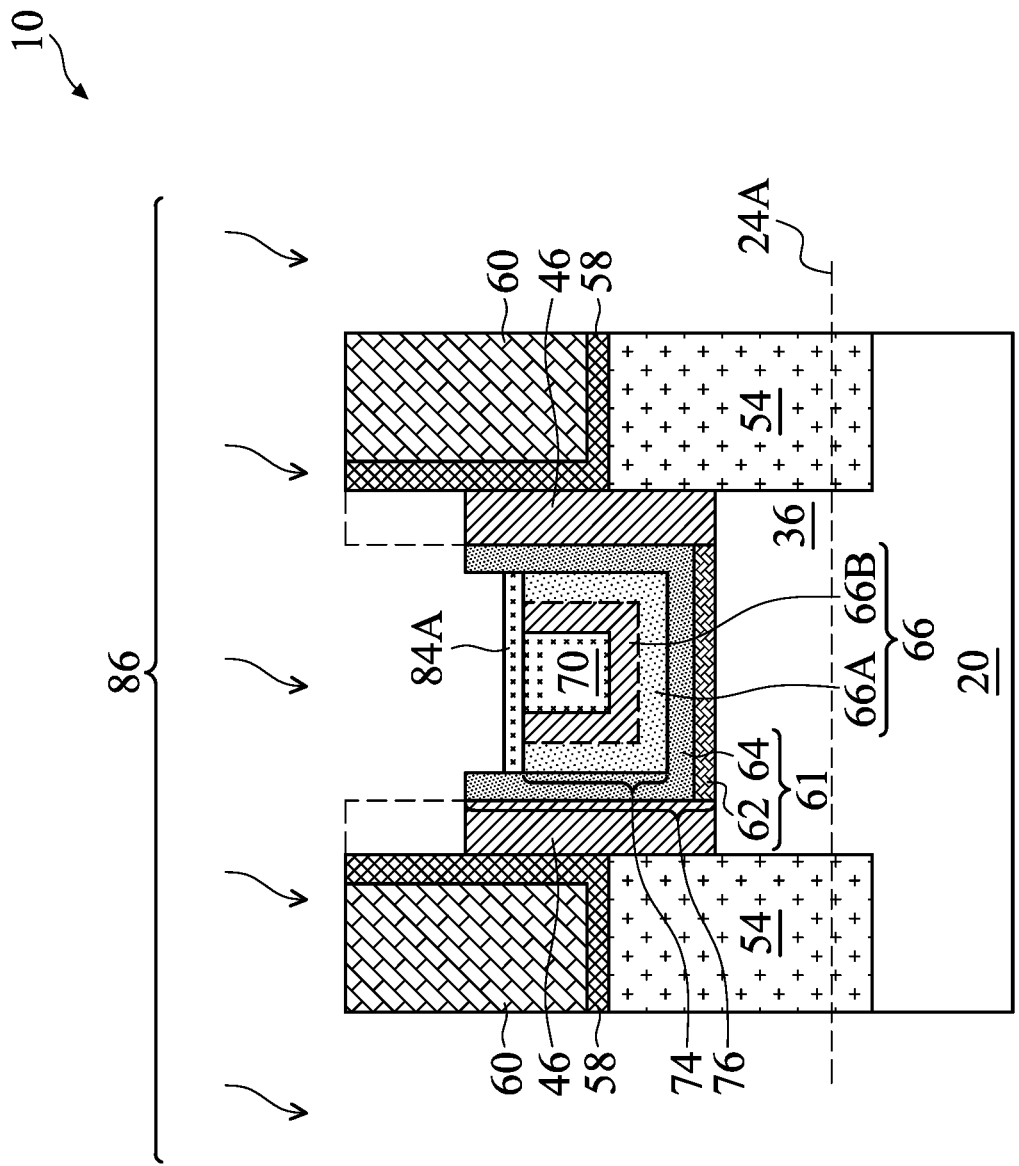

Referring to FIG. 17, after the bottom sub layer 84A is deposited, passivation process 86 is performed. The respective process is illustrated as process 234 in the process flow 200 shown in FIG. 23. In accordance with alternative embodiments, passivation process 86 is skipped. Accordingly, the step 234 in FIG. 23 is illustrated using a dashed box to indicate it may be performed or skipped. Passivation process 86 may be performed using a method and a process gas selected from the same candidate group of methods and process gases for passivation process 82 (FIG. 15). Accordingly, the details are not repeated herein. Furthermore, the passivation process 86 may be performed using the same method and process gases or different methods and process gases.

Figure 18:
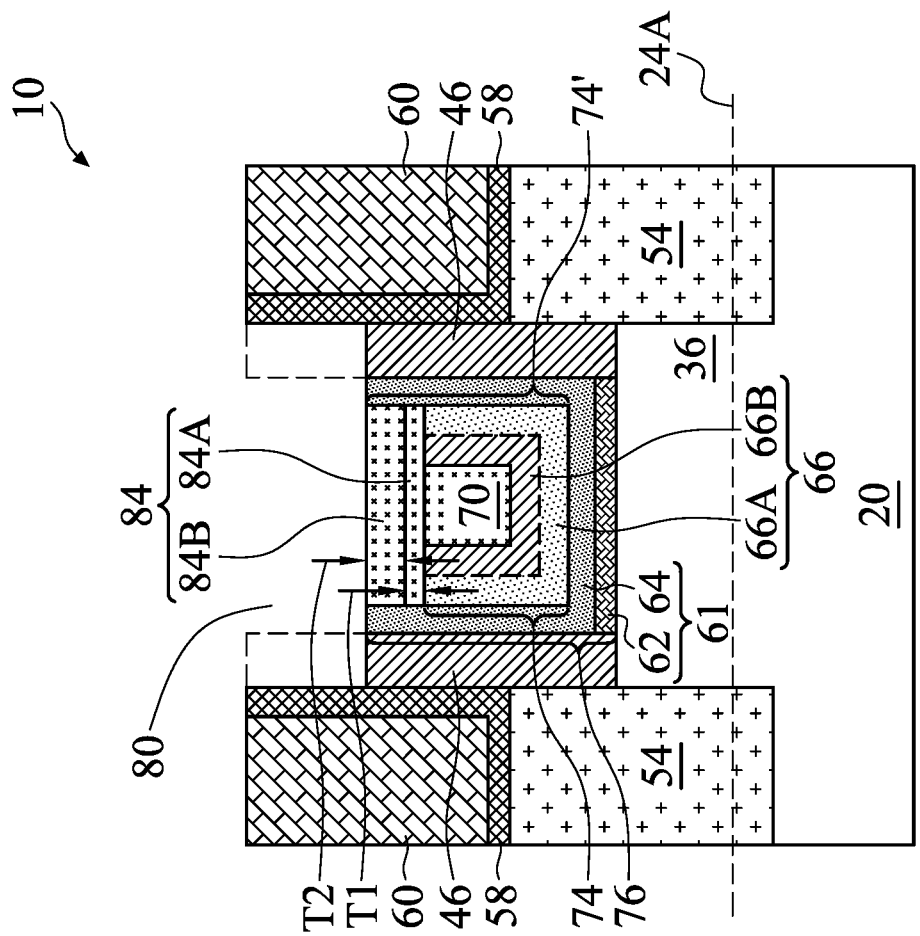

Referring to FIG. 18, after the formation of bottom sub layer 84A and the possible passivation process 86, metal layer 84B (referred to as top sub (metal) layer 84B hereinafter) is selectively deposited on bottom sub layer 84A. The respective process is illustrated as process 236 in the process flow 200 shown in FIG. 23. The resistivity of the top sub layer 84B is also lower than the resistivity of the layers (which include layers 66 and 70) in gate electrode 74. Top sub layer 84B is formed using bottom sub layer 84A as a seed layer, and hence is not deposited on the exposed surfaces of dielectric materials such as gate spacers 46, high-k dielectric layer 64, CESL 58, and ILD 60. In accordance with some embodiments, the deposition of top sub layer 84B is performed using ALD. The precursor is different from the precursor for depositing bottom sub layer 84A. For example, the precursor for forming top sub layer 84B may include $WF_6$ and a reducing agent such as $H_2$. The process may include a plurality of ALD cycles, each including conducting $WF_6$, purging $WF_6$, conducting $H_2$, and purging $H_2$. The deposition process may be a thermal process performed at an elevated temperature, such as in the range between about 250° C. and about 400° C.

Sub layers 84A and 84B have different functions. Bottom sub layer 84A (which may be formed using WCl$_5$) is able to be selectively grown on gate electrode 74 (such as TiN) without being deposited on the exposed dielectric layers. However, bottom sub layer 84A cannot be deposited to be too thick because with the continued deposition of bottom sub layer 84A, it will eventually be deposited on the exposed dielectric layers. Accordingly, the deposition of bottom sub layer 84A is stopped before it starts to be deposited on the exposed dielectric layers. In accordance with some embodiments, the thickness of bottom sub layer 84A is smaller than about 3 nm to ensure it is not deposited on the exposed dielectric layers. On the other hand, bottom sub layer 84A is used as a seed layer for the selective growth of top sub layer 84B, which does not grow on gate electrode 74. Bottom sub layer 84A thus has a high-enough thickness to ensure it fully covers the exposed gate electrode 74, and hence the thickness of bottom sub layer 84A is greater than about 1 nm. Accordingly, the thickness T1 of bottom sub layer 84A may be in the range between about 1 nm and about 3 nm.

Top sub layer 84B (which may be formed using WF$_6$) is deposited on metal such as bottom sub layer 84A, and is not deposited on the exposed dielectric layer, even if the deposition of top sub layer 84B lasts for a long period of time. Accordingly, with the bottom sub layer 84A being formed as the seed layer, top sub layer 84B is selectively deposited on bottom sub layer 84A. When the thickness T2 of top sub layer 84B is high, it still does not grow on the exposed dielectric layers. Accordingly, the thickness T2 of top sub layer 84B may be increased without the concern of being grown on the exposed dielectric layers. The thickness T2 of top sub layer 84B may be greater than about 1 nm, and may be greater than about 3 nm, greater than about 5 nm, or greater. In accordance with some embodiments, thickness T2 is in the range between about 1 nm and about 5 nm. The top surface of top sub layer 84B may be level with or slightly lower than the top ends of high-k dielectric layer 64. Bottom sub layers 84A and top sub layers 84B are collectively referred to as low-resistivity conductive layer 84. Throughout the description, low-resistivity conductive layer 84 is considered as a part of gate electrode, which is denoted as 74'. Low-resistivity conductive layers 84A and 84B in combination may reach a high-enough thickness and hence the overall resistivity of gate electrode 74 (which includes low-resistivity conductive layer 84) may be reduced.

Due to the selective deposition, sub layers 84A and 84B may be conformal layers. Furthermore, sub layers 84A and 84B may be substantially planar if the top surface of the underlying portion of gate electrode 74' is planar. Alternatively, sub layers 84A and 84B are curved and have the topology following the top-surface profile of the respective underlying portions of gate electrode 74'.

Figure 19:
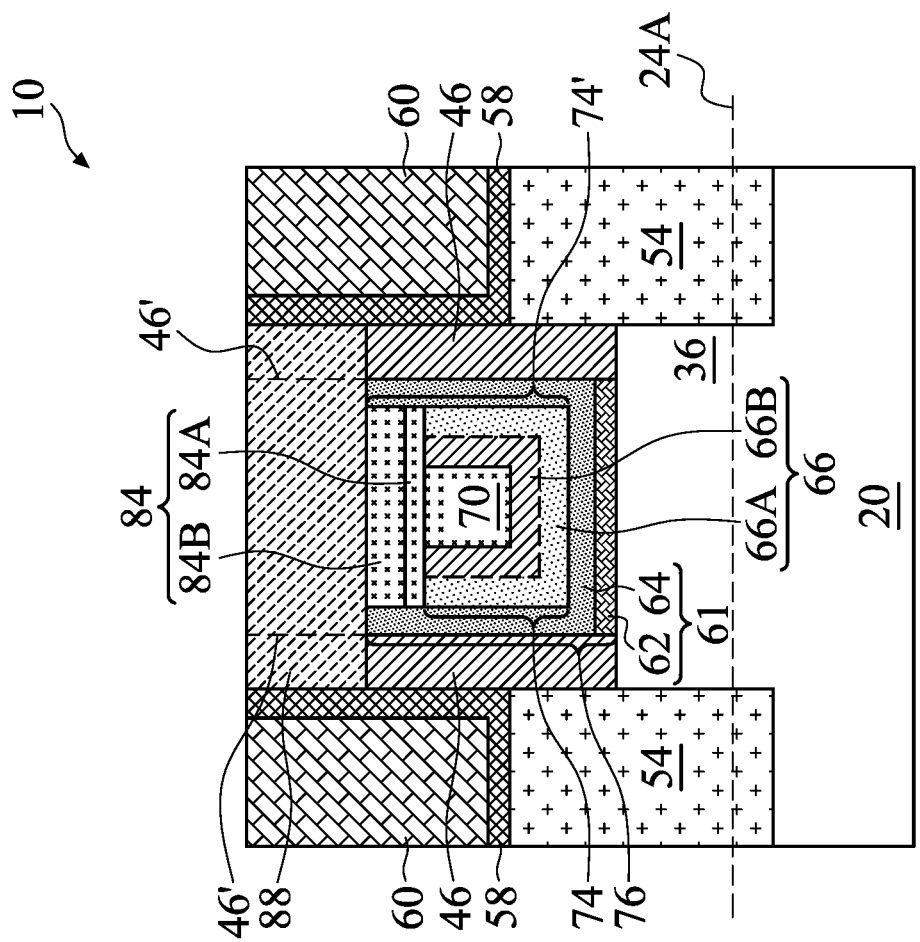

Next, referring to FIG. 19, the remaining recesses 80 and 81 (if any) are filled with a dielectric material to form self-aligned hard mask 88. The respective process is illustrated as process 238 in the process flow 200 shown in FIG. 23. Self-aligned hard mask 88 may be formed of a non-low-k dielectric material such as silicon nitride, silicon oxynitride, silicon oxy-carbide, or the like. Self-aligned hard mask 88 may also be formed of a homogeneous low-k dielectric material, which may be formed of porous silicon nitride, porous silicon oxynitride, porous silicon oxy-carbide, or the like. Self-aligned hard mask 88 is also planarized so that its top surface is coplanar with the top surface of ILD 60. In accordance with some embodiments, the sidewalls of self-aligned hard mask 88 are in contact with the sidewalls of CESL 58. In accordance with other embodiments in which gate spacers 46 are not recessed, the sidewalls of self-aligned hard mask 88 are in contact with the sidewalls of the top portions (illustrated as dashed lines 46') of gate spacers 46.

Figure 20B:
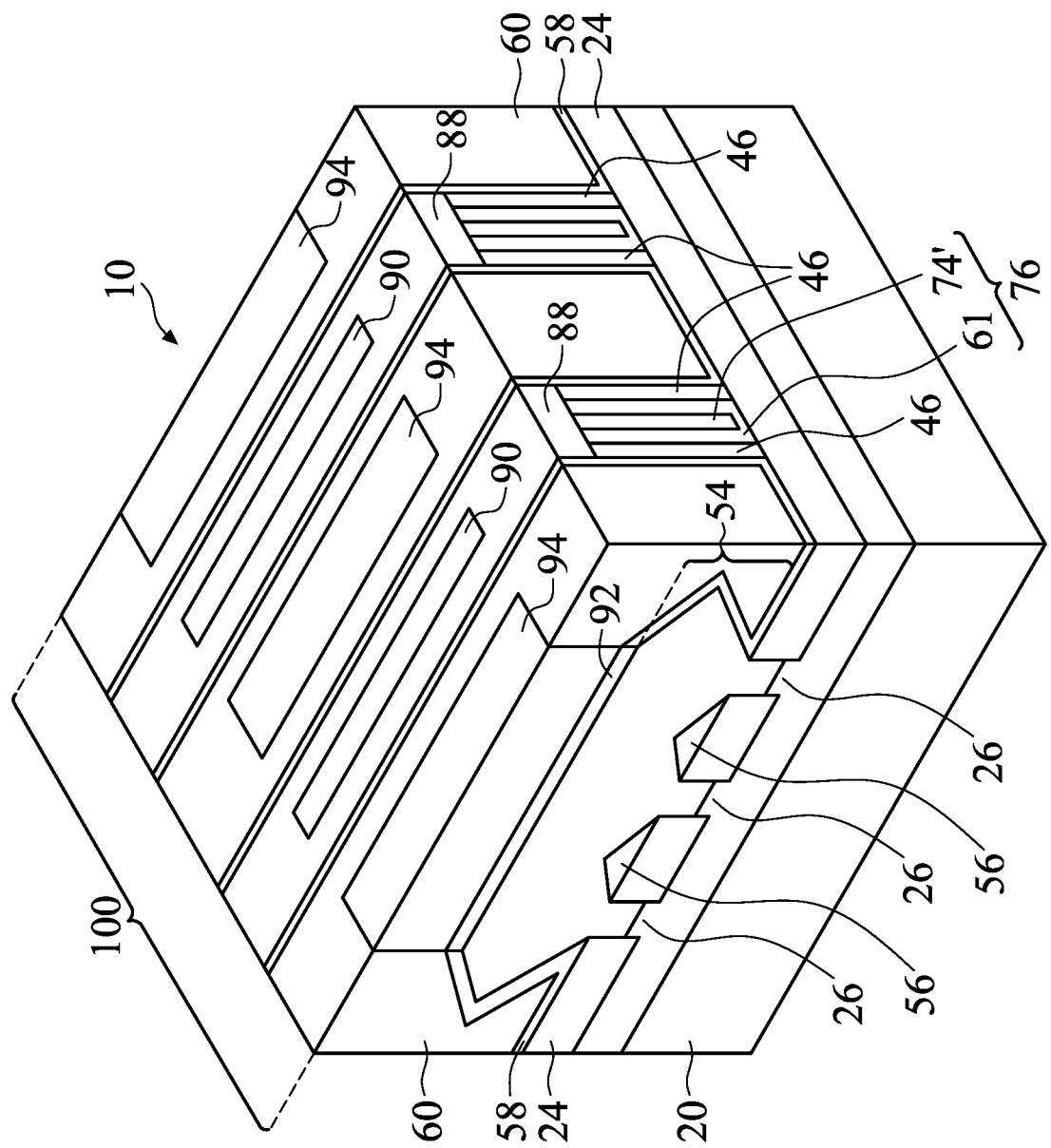

FIG. 20A illustrates the formation of gate contact plug 90, source/drain silicide regions 92, and source/drain contact plugs 94. The respective process is illustrated as process 240 in the process flow 200 shown in FIG. 23. The formation of source/drain contact plugs 94 includes forming contact openings by etching ILD 60 to expose the underlying portions of CESL 58, and then etching the exposed portions of CESL 58 to reveal source/drain regions 54. In a subsequent process, a metal layer (such as a titanium layer) is deposited to extend into the contact openings. A metal nitride blocking layer (such as a TiN layer) may be formed. An anneal process is then performed to react the metal layer with the top portion of source/drain regions 54 to form silicide regions 92. Next, either the previously formed metal nitride layer is left without being removed, or the previously formed metal nitride layer is removed, followed by the deposition of a new metal nitride layer (such as a titanium nitride layer). A filling metallic material such as tungsten, cobalt, or the like, is then filled into the contact openings, followed by a planarization process to remove excess materials, resulting in source/drain contact plugs 94. The formation of gate contact plug 90 may include etching self-aligned hard mask 88 to reveal top sub layer 84B, and forming gate contact plug 90 in the corresponding openings. Gate contact plug 90 may also include a diffusion barrier layer (such as titanium nitride) and a metal (such as copper, tungsten, cobalt, or the like) over the diffusion barrier layer. FinFET 100 is thus formed. FIG. 20B illustrates a perspective view of FinFET 100.

In FIG. 20A, thickness ratio T2/T1 is designed to be in a range that is not too big and not small. When the ratio T2/T1 is too big, either thickness T1 is too small, and/or thickness T2 is too big. If thickness T1 is too small, bottom sub layer 84A may not be able to fully cover gate electrode 66, and cannot function as an effective seed layer. If thickness T2 is too big, the top surface of the top sub layer 84B may be higher than the top ends of high-k dielectric layer 64, causing problems for the subsequent formation of self-aligned hard mask 88. On the other hand, when the ratio T2/T1 is too small, either thickness T1 is too big, and/or thickness T2 is too small. If thickness T1 is too big, bottom sub layer 84A may be grown on dielectric materials such as ILD 60, and the deposition of bottom sub layer 84A and top sub layer 84B is not selective. If thickness T2 is too small, the resistance of layer 84B (and hence the total resistance of layers 84A and 84B) is high, defeating the purpose of forming the low-resistivity conductive layers 84A and 84B. In accordance with some embodiments, ratio T2/T2 is in the range between 1 and about 5.

To ensure that top sub layer 84B does not grow on top of high-k dielectric layer 64 and gate spacers 46, the top surface of top sub layer 84B may be level with the top ends of high-k dielectric layer 64 and/or the top ends of gate spacers 46 in accordance with some embodiments. In accordance with alternative embodiments, the top surface of top sub layer 84B is lower than the top ends of high-k dielectric layer 64 and/or the top ends of gate spacers 46 by a difference to provide a process margin. The difference may be smaller than about 1 nm.

As shown in FIG. 20A, the bottom surface of gate contact plug 90 may extend from the illustrated left edge to the illustrated right edge of top sub layer 84B. Alternatively, the bottom surface of gate contact plug 90 may be laterally recessed from the left edge and/or the right edge of top sub layer 84B, as illustrated in FIG. 20A. In accordance with yet alternative embodiments, the bottom surface of gate contact plug 90 may extend on and contact the top ends of high-k dielectric layer, and may, or may not, extend on and contact the top ends of gate spacers 46.

Figure 21:
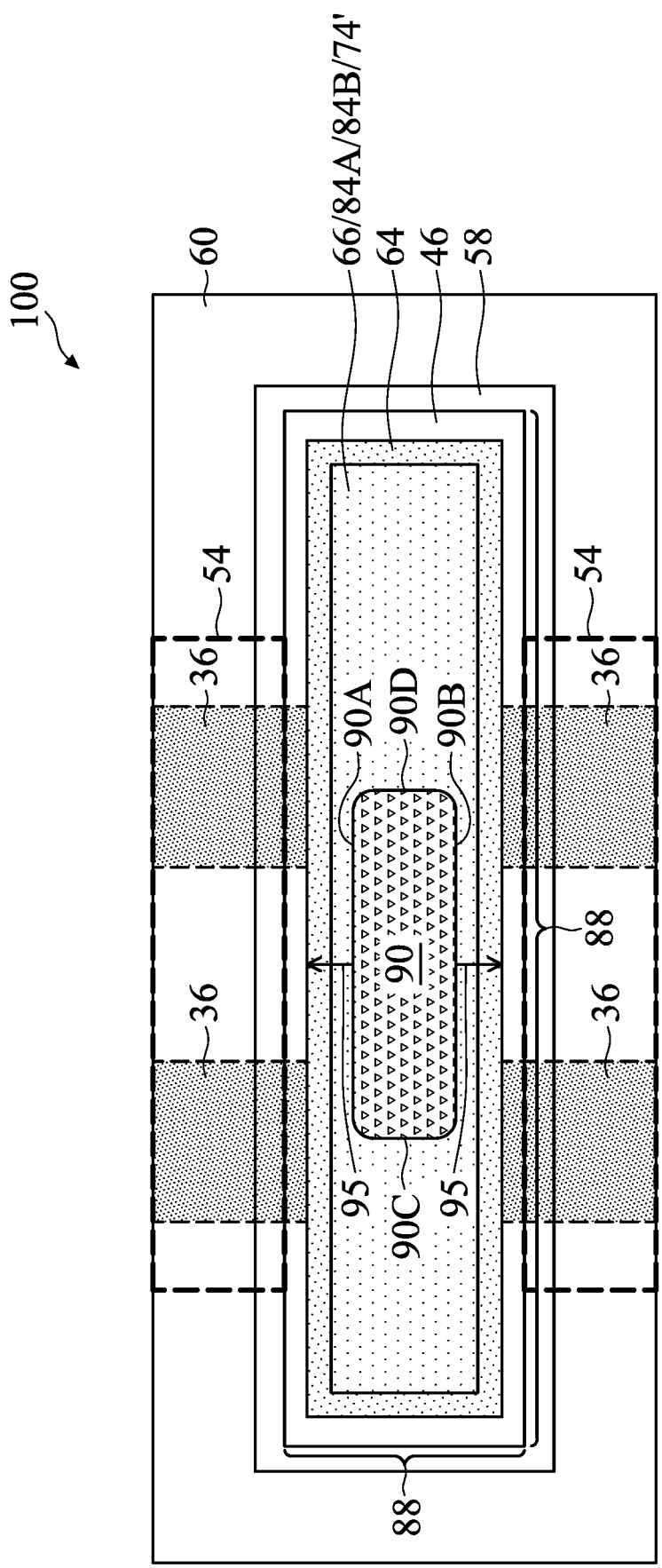
FIG. 21 illustrates a plane view of a FinFET in accordance with some embodiments.

FIG. 21 illustrates a top view of some portions of FinFET 100. Gate electrode 74' and the overlying low-resistivity conductive layers 84A and 84B. The vertical portions of high-k dielectric layer 64 may form rings encircling the corresponding gate electrode 74' (including the corresponding overlying low-resistivity conductive layer 84). Gate contact plug 90, protruding fins 36, and source/drain regions 54 are also illustrated.

As shown in FIG. 21, low-resistivity conductive layers 84A and 84B may fully overlap work function layer 66, and the edges of conductive layers 84A and 84B may be flushed with the corresponding edges of work function layer 66. High-k gate dielectric 64 may form a ring contacting the sidewalls of low-resistivity conductive layers 84A and 84B and work function layer 66. Hard mask 88 may be fully encircled by the vertical portions of CESL 58. Gate contact plug 90 may contact a portion, and not all, of top sub layer 84B, with low-resistivity conductive layers 84A and 84B extending beyond the left sidewall 90C and the right sidewall 90D of gate contact plug 90. It is appreciated that although the sidewalls 90A and 90B of gate contact plug 90 are shown as being directly on top sub layer 84B, sidewalls 90A and 90B may extend in the direction of arrows 95 and may be at any position on the paths of arrows 95.

Figure 22:
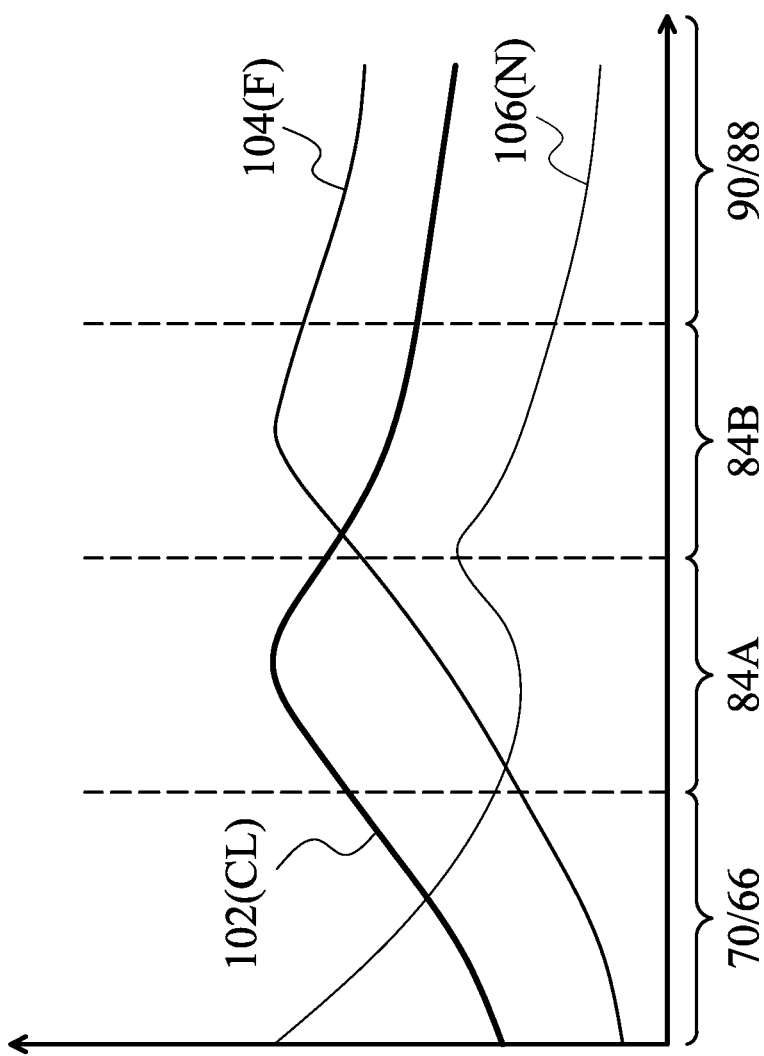
FIG. 22 illustrates the distribution of some elements in accordance with some embodiments.

FIG. 22 illustrates the schematic distribution of some elements, wherein the atomic percentages of elements F, Cl, and N are illustrated as a function of the height in gate electrode 74, wherein the height is measured in the direction of arrow 108 in FIG. 20A. Lines 102, 104, and 106 illustrate the example atomic percentages of chlorine, fluorine, and nitrogen, respectively. As shown by line 102, when bottom sub layer 84A is formed adopting $WCl_5$ as a process gas, the peak atomic percentage of Cl is in bottom sub layer 84A, and the Cl atomic percentage reduces gradually in top sub layer 84B (and dielectric hard mask 88) and work function layer 66. As shown by line 104, since top sub layer 84B may be formed adopting $WF_6$ as a process gas, the peak atomic percentage of F is in top sub layer 84B, and the F atomic percentage reduces gradually in bottom sub layer 84A and dielectric hard mask 88 and gate contact plug 90. The distribution of lines 102 and 104 may be observed using X-ray photoelectron spectroscopy (XPS). In accordance with some embodiments, the peak atomic percentage of F in top sub layer 84B is higher than about 12 percent, and may be in the range between about 5 percent and about 20 percent. The peak atomic percentage of Cl in bottom sub layer 84A is higher than about 10 percent, and may be in the range between about 5 percent and about 20 percent.

Line 106 illustrates an embodiment in which passivation process 86 is performed using $N_2$ after the deposition of layer 84A and before the deposition of layer 84B. In accordance with some embodiments, a peak nitrogen atomic percentage is at the interface between layers 84A and 84B, and the nitrogen atomic percentage dips in both of sub layers 84A and 84B. The distribution of line 106 may be observed using Energy Dispersive X-Ray Spectroscopy (EDS or EDX). Also, the two layers 84A and 84B may be distinguished from each other using EDX. Experiments also revealed that sub layers 84A and 84B may be distinguished from each other using Transmission electron microscopy (TEM) due to their crystallinity difference.

The embodiments of the present disclosure have some advantageous features. By forming a first low-resistivity conductive layer, it is possible to achieve the selective deposition of the first low-resistivity conductive layer on gate electrode, and not on the exposed dielectric layers. The loss of selectivity due to the prolonged disposition of the low-resistivity conductive layer is solved by stopping the deposition of the first low-resistivity conductive layer, and depositing a second low-resistivity conductive layer that is selectively deposited on metal. The selectivity is deposition is not lost when the thickness of the second low-resistivity conductive layer is increased.

In accordance with some embodiments of the present disclosure, a method comprises forming a gate electrode on a semiconductor region; recessing the gate electrode to generate a recess; performing a first deposition process to form a first metallic layer on the gate electrode and in the recess, wherein the first deposition process is performed using a first precursor; performing a second deposition process to form a second metallic layer on the first metallic layer using a second precursor different from the first precursor, wherein the first metallic layer and the second metallic layer comprise a same metal; forming a dielectric hard mask over the second metallic layer; and forming a gate contact plug penetrating through the dielectric hard mask, wherein the gate contact plug contacts a top surface of the second metallic layer. In an embodiment, the first precursor comprises tungsten chloride ($WCl_5$), and the second precursor comprises tungsten fluoride ($WF_6$). In an embodiment, in the first deposition process, surfaces of dielectric materials adjacent to the gate electrode are exposed, and the first deposition process is stopped before the first metal layer starts growing on exposed dielectric materials adjacent to the gate electrode. In an embodiment, each of the first deposition process and the second deposition process comprises an atomic layer deposition process. In an embodiment, the recessing the gate electrode comprises a first recessing process to recess the gate electrode, a gate dielectric, and gate spacers, wherein the gate dielectric comprises first sidewall portions on sidewalls of the gate electrode, and the gate electrode and the gate dielectric are between the gate spacers; and a second recessing process to recess the gate electrode to be lower than top edges of the gate dielectric. In an embodiment, the first metallic layer has a first thickness smaller than about 3 nm. In an embodiment, the second metallic layer has a second thickness greater than about 3 nm.

In accordance with some embodiments of the present disclosure, a device includes a semiconductor region; a gate dielectric over the semiconductor region; a gate electrode comprising a first portion comprising a work-function layer therein; and a second portion overlying and contacting the first portion, wherein the second portion comprises fluorine and chlorine, and wherein the second portion comprises a bottom sub layer, wherein a first peak atomic percentage of chlorine is in the bottom sub layer; and a top sub layer over and contacting the bottom sub layer, wherein a second peak atomic percentage of fluorine is in the top sub layer, and wherein the bottom sub layer and the top sub layer comprise a same metal; and a gate contact plug over and contacting the top sub layer. In an embodiment, the first portion comprises titanium, and the second portion comprises tungsten. In an embodiment, the bottom sub layer and the top sub layer are distinguishable through Transmission electron microscopy (TEM). In an embodiment, the gate dielectric comprises sidewall portions, and a bottom portion underlying and connected to the sidewall portions, and wherein the first portion and the second portion of the gate electrode are between the sidewall portions. In an embodiment, a top surface of the top sub layer is level with or lower than top edges of the sidewall portions of the gate dielectric. In an embodiment, the device further comprises gate spacers on opposing sides of the gate dielectric and the gate electrode; and an inter-layer dielectric, with the gate spacers in the inter-layer dielectric, wherein a first top surface of the gate dielectric is recessed lower than a second top surface of the inter-layer dielectric. In an embodiment, the gate spacers are recessed to have a third top surface lower than the second top surface.

In accordance with some embodiments of the present disclosure, a device includes a semiconductor substrate; isolation regions extending into the semiconductor substrate; a semiconductor fin protruding higher than portions of the isolation regions on opposing sides of the semiconductor fin; and a gate stack comprising a high-k gate dielectric on the semiconductor fin; a work function layer on the high-k gate dielectric; a capping layer; a first tungsten layer over and contacting the work function layer and the capping layer; and a second tungsten layer over and contacting the first tungsten layer, wherein the first tungsten layer and the second tungsten layer are distinguishable from each other. In an embodiment, both of the first tungsten layer and the second tungsten layer comprise fluorine and chlorine, and wherein a first peak atomic percentage of chlorine is in the first tungsten layer. In an embodiment, a second peak atomic percentage of fluorine is in the second tungsten layer. In an embodiment, both of the first tungsten layer and the second tungsten layer comprise nitrogen, and wherein nitrogen atomic percentages in the gate stack has a peak at an interface between the first tungsten layer and the second tungsten layer. In an embodiment, the high-k gate dielectric comprises sidewall portions on opposing sides of the first tungsten layer and the second tungsten layer, and a top surface of the second tungsten layer is between, and is level with or lower than top edges of the sidewall portions of the high-k gate dielectric. In an embodiment, the capping layer comprises titanium nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate electrode over a semiconductor region;
    recessing the gate electrode to generate a recess;
    performing a first deposition process to form a first metallic layer on the gate electrode and in the recess, wherein the first deposition process is performed using a first precursor;
    performing a second deposition process to form a second metallic layer on the first metallic layer using a second precursor different from the first precursor, wherein the first metallic layer and the second metallic layer comprise a same metal;
    forming a dielectric hard mask over the second metallic layer; and
    forming a gate contact plug penetrating through the dielectric hard mask, wherein the gate contact plug contacts a top surface of the second metallic layer.

2. The method of claim 1, wherein the first precursor comprises tungsten chloride ($WCl_5$), and the second precursor comprises tungsten fluoride ($WF_6$).

3. The method of claim 1, wherein in the first deposition process, surfaces of dielectric materials adjacent to the gate electrode are exposed, and the first deposition process is stopped before the first metal layer starts growing on exposed dielectric materials adjacent to the gate electrode.

4. The method of claim 1, wherein each of the first deposition process and the second deposition process comprises an atomic layer deposition process.

5. The method of claim 1, wherein the recessing the gate electrode comprises:
    a first recessing process to recess the gate electrode, a gate dielectric, and gate spacers, wherein the gate dielectric comprises first sidewall portions on sidewalls of the gate electrode, and the gate electrode and the gate dielectric are between the gate spacers; and
    a second recessing process to recess the gate electrode to be lower than top edges of the gate dielectric.

6. The method of claim 1, wherein the first metallic layer has a first thickness smaller than about 3 nm.

7. The method of claim 6, wherein the second metallic layer has a second thickness greater than about 3 nm.

8. A method comprising:
    forming a gate dielectric over a semiconductor region;
    forming a gate electrode comprising:
        forming a first portion comprising a work-function layer therein; and
        forming a second portion overlying and contacting top surfaces of the first portion, wherein the second portion comprises fluorine and chlorine, and wherein the forming the second portion comprises:
            depositing a bottom sub layer; and
            depositing a top sub layer over and contacting the bottom sub layer, wherein the top sub layer comprises an element different from elements in the bottom sub layer; and
    forming a gate contact plug over and contacting the top sub layer.

9. The method of claim 8, wherein the bottom sub layer is deposited using first precursors free from chlorine, and the top sub layer is deposited using a second precursor comprising fluorine.

10. The method of claim 9, wherein the first precursors comprise a chlorine-comprising gas.

11. The method of claim 9, wherein the bottom sub layer and the top sub layer are deposited using tungsten chloride and tungsten fluoride, respectively, as precursors.

12. The method of claim 8, wherein the top sub layer is deposited as being thicker than the bottom sub layer.

13. The method of claim 8 further comprising:
    after the work-function layer is formed, preforming a first etching process to recess the first portion of the gate electrode, wherein the gate dielectric is recessed by the first etching process; and
    after the first etching process, preforming a second etching process to further recess the first portion of the gate electrode, wherein the gate dielectric is not recessed by the second etching process.

14. The method of claim 8, wherein the first portion comprises titanium, and the second portion comprises tungsten.

15. The method of claim 8, wherein the gate dielectric comprises sidewall portions, and a bottom portion underlying and connected to the sidewall portions, and wherein both of the first portion and the second portion of the gate electrode are between the sidewall portions.

16. The method of claim 8, wherein a top surface of the top sub layer is level with or lower than topmost edges of the gate dielectric.

17. The method of claim 8, wherein both of the bottom sub layer and the top sub layer are deposited using atomic layer deposition processes.

18. A method comprising:
   forming isolation regions extending into a semiconductor substrate;
   recessing the isolation regions to form a semiconductor fin on opposing sides of the semiconductor fin, wherein the semiconductor fin protrudes higher than remaining portions of the isolation regions; and
   forming a gate stack comprising:
      a high-k gate dielectric on the semiconductor fin; and
      a work function layer on the high-k gate dielectric;
   depositing a first tungsten layer over and contacting the gate stack; and
   depositing a second tungsten layer over and contacting the first tungsten layer, wherein the first tungsten layer and the second tungsten layer are distinguishable from each other.

19. The method of claim 18, wherein the first tungsten layer comprises chlorine, and the second tungsten layer comprises fluorine.

20. The method of claim 18 further comprising, before the first tungsten layer is deposited:
   performing a first etching process to recess the gate stack, wherein the first etching process is performed using a first etching chemical; and
   performing a second etching process to recess the gate stack, wherein the second etching process is performed using a second etching chemical different from the first etching chemical.

* * * * *